US009887537B2

(12) United States Patent
Wyland et al.

(10) Patent No.: US 9,887,537 B2
(45) Date of Patent: Feb. 6, 2018

(54) ANALOG LIMIT ON DIGITALLY SET PULSE WIDTHS

(71) Applicant: Microsoft Technology Licensing, LLC, Redmond, WA (US)

(72) Inventors: David C. Wyland, Morgan Hill, CA (US); Agustya Ruchir Mehta, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 332 days.

(21) Appl. No.: 14/755,877

(22) Filed: Jun. 30, 2015

(65) Prior Publication Data
US 2017/0005465 A1    Jan. 5, 2017

(51) Int. Cl.
*H02H 3/22* (2006.01)
*H02H 9/04* (2006.01)
(Continued)

(52) U.S. Cl.
CPC .............. *H02H 9/04* (2013.01); *G01S 7/484* (2013.01); *G06F 3/011* (2013.01); *H01S 5/0014* (2013.01);
(Continued)

(58) Field of Classification Search
USPC .......................................... 361/56, 91.1, 111
See application file for complete search history.

(56) References Cited

U.S. PATENT DOCUMENTS 5,450,427 A    9/1995 Fermann et al.
5,498,935 A    3/1996 McMahan et al.
(Continued)

FOREIGN PATENT DOCUMENTS

DE    10139929 A1    2/2003
EP    0354435 A2    2/1990
EP    467682 A2    1/1992

OTHER PUBLICATIONS

"International Search Report and Written Opinion Issued in PCT Application No. PCT/US2016/037471", dated Feb. 1, 2017, 20 pages.
(Continued)

*Primary Examiner* — Danny Nguyen
(74) *Attorney, Agent, or Firm* — Rainier Patents, P.S.

(57) ABSTRACT

A power switching device (e.g., a power MOSFET) drives relatively large surges of pulsed power through a laser emitter of a Time of Flight (TOF) determining system where both the power switching device and laser emitter are closely packed on a printed circuit board having further closely packed and temperature sensitive other components. Waveforms of pulse trains that control the power switching device are programmably defined and thus may include pulse durations that are unduly large or spacing between pulses that are unduly small such that overheating may occur. A pulse duration limiting circuit is provided having an analog integrator configured to integrate over time, the programmably defined pulses and a voltage triggered clamping device coupled to an output of the analog integrator. The voltage triggered clamping device has a predetermined threshold voltage at and above which it is switched from a relatively low transconductances mode to a substantially higher transconductances mode. The voltage triggered clamping device is coupled to a current supplying circuit branch of the system, the current supplying circuit branch being one that has an ability to supply current for switching on the power switching device.

20 Claims, 9 Drawing Sheets

(51) Int. Cl.
*H03K 17/0812* (2006.01)
*G01S 7/484* (2006.01)
*H01S 5/00* (2006.01)
*G06F 3/01* (2006.01)
*H03K 17/08* (2006.01)
*H01S 5/042* (2006.01)

(52) U.S. Cl.
CPC ...... *H03K 17/08122* (2013.01); *H01S 5/0428* (2013.01); *H03K 2017/0806* (2013.01)

(56) References Cited

U.S. PATENT DOCUMENTS

| | | | |
|---|---|---|---|
| 5,579,328 | A | 11/1996 | Habel et al. |
| 6,335,654 | B1 | 1/2002 | Cole |
| 6,609,842 | B1 | 8/2003 | Kimbrough |
| 6,801,557 | B2 | 10/2004 | Liu |
| 6,833,910 | B2 | 12/2004 | Bøgh-Andersen |
| 6,839,363 | B2 | 1/2005 | Lin et al. |
| 8,014,118 | B2 * | 9/2011 | Ikegami ................ G09G 3/296 361/111 |
| 8,427,226 | B2 | 4/2013 | Grbovic |
| 8,537,459 | B2 | 9/2013 | Nati et al. |
| 8,755,420 | B2 | 6/2014 | Grove et al. |
| 2002/0135344 | A1 | 9/2002 | Tamai et al. |
| 2006/0126253 | A1 * | 6/2006 | Urakabe ................ H02M 1/38 361/118 |
| 2008/0030910 | A1 * | 2/2008 | Fairgrieve ........ H03K 17/08142 361/56 |
| 2011/0279366 | A1 | 11/2011 | Lohbihler |
| 2013/0114016 | A1 * | 5/2013 | Lim ................... H05B 33/0827 349/43 |
| 2013/0265563 | A1 | 10/2013 | Vogt et al. |
| 2014/0184496 | A1 | 7/2014 | Gribetz et al. |

OTHER PUBLICATIONS

Response to International Search Report and Written Opinion dated Apr. 5, 2017 in PCT Application No. PCT/US2016/037471, 6 pages.
"Second Written Opinion Issued in PCT Application No. PCT/US2016/037471", dated Jun. 27, 2017, 11 pages.
"D100 High Current Laser Driver", Published on: Mar. 26, 2014 Available at: http://www.highlandtechnology.com/dyn/files/doc/D100DSA1.pdf.
Palomar, et al., "Characteristics of the Long Duration Pulses in a Shunt Linear Voltage Regulator", In Proceedings of Nuclear Instruments and Methods in Physics Research Section A: Accelerators, Spectrometers, Detectors and Associated Equipment, Nov. 26, 2013, 17 pages.
"LDP-3830 Laser Protection", Retrieved on: Apr. 2, 2015 Available at: http://assets.newport.com/webdocuments-en/images/tn3830-1_laser_protect_3830_ix.pdf.
"International Preliminary Report on Patentability Issued in PCT Application No. PCT/US2016/037471", Dated: Oct. 4, 2017, 13 pages.

* cited by examiner

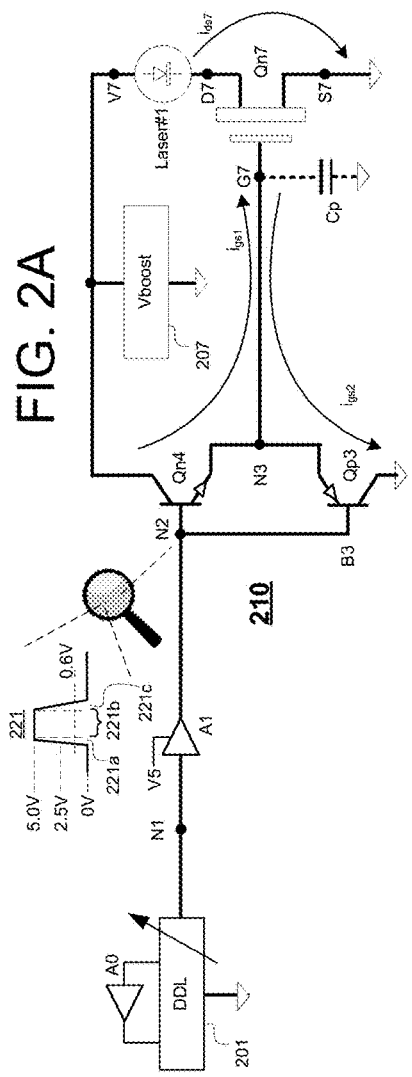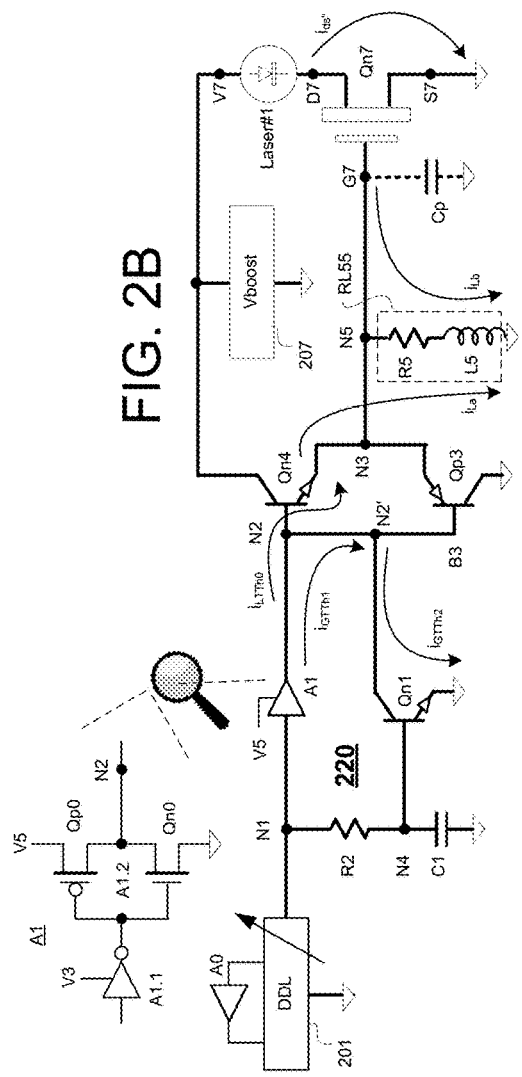

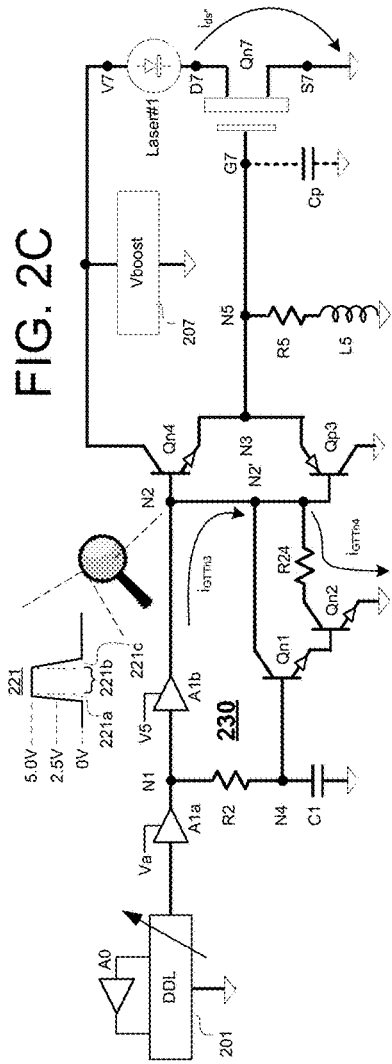
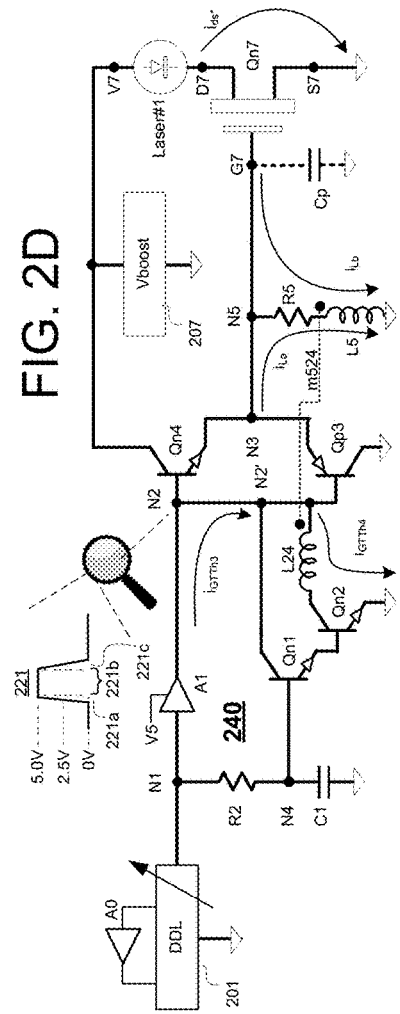

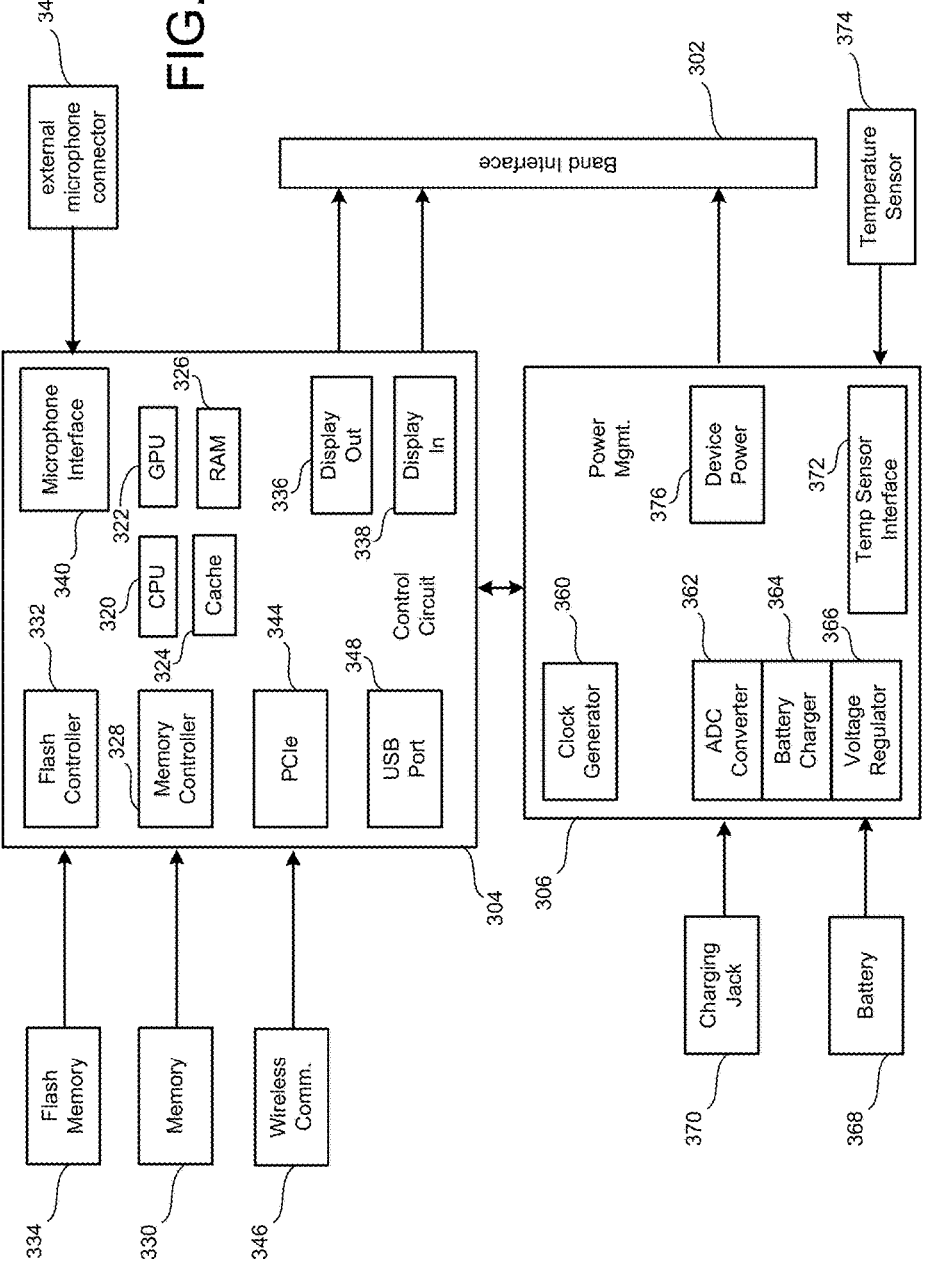

ANALOG LIMIT ON DIGITALLY SET PULSE WIDTHS

BACKGROUND

Digitally controlled pulse width modulation (PWM) is increasingly finding application in high frequency, high timing resolution systems. One example is a Time of Photonic Flight determining sub-system (also referred to as a TOF sub-system or LIDAR sub-system). Such sub-systems may be used for example in three-dimensional (3D) augmented reality systems. The digital control of the PWM may be a programmable one where programming allows for risky settings.

SUMMARY

In accordance with one aspect of the present disclosure, a power switching device (e.g., a power MOSFET) that drives relatively large surges of pulsed power (e.g., 0.5 Amperes or more per pulse) through a high power load (e.g., light emitter such as a laser diode) of a Time of Flight (TOF) determining system is closely packed next to its driven load (e.g., the laser diode). In one embodiment, both the power switching device and its driven load (e.g., light emitter) are mounted substantially adjacent to one another on a printed circuit board having further closely packed and temperature sensitive other components. Waveforms of pulse trains that control the power switching device are programmably defined and thus may include pulse durations that are programmably caused to be unduly large or are programmably caused to have spacings between successive pulses that are unduly small such that overheating may occur due to risky settings of the programmed pulse widths and/or spacings between them. A pulse duration limiting circuit is provided having an analog integrator configured to integrate over time, the programmably defined digital pulses. A voltage triggered clamping device is coupled to an output of the analog integrator and is tripped when the integrator output becomes equal to or greater than a predetermined threshold voltage. The threshold voltage is one at and above which the voltage triggered clamping device switches from a first transconductance mode having relatively low transconductances mode to a second transconductance mode having substantially higher transconductances. The voltage triggered clamping device is coupled to a current supplying circuit branch of the system where the current supplying circuit branch is used to supply current for switching on the power switching device (e.g., power MOSFET) of the system. If the current supplying circuit branch is stopped or inhibited from supplying its current, the corresponding high powered output components of the system (e.g., laser diodes) are switched off or switched into a reduced power consumption mode. Thus, if the voltage triggered clamping device remains in its relatively first transconductances mode, it does not significantly interfere with the ability of the current supplying circuit branch to supply current for switching on the one or more of the high powered components of the system. On the other hand, when the voltage triggered clamping device is triggered into its second transconductance mode having the substantially higher transconductances, it removes current from the current supplying circuit branch and thereby significantly impedes the ability of the current supplying circuit branch to supply current for switching on the one or more of the high powered components of the system. Thus the high powered components (e.g., laser diode and power switching device) are automatically switched off or switched into lower power modes and risk of overheating of on-board components is reduced or prevented.

This brief Summary is provided to introduce a selection of concepts in a simplified form that are further described below in the Detailed Description. This brief Summary is not intended to identify key features or essential features of claimed subject matter, nor is it intended to be used as an aid in determining the scope of the claimed subject matter.

BRIEF DESCRIPTION OF THE DRAWINGS

FIG. 2A is a schematic diagram of a first circuit for turning on and off high powered components and in which on time may be unduly lengthened or off time may be unduly shortened.

FIG. 2B is a schematic diagram of a second circuit for turning on and off high powered components and in which on time is hardware limited.

FIG. 2C is a schematic diagram of a third circuit for turning on and off high powered components and in which on time is hardware limited.

FIG. 2D is a schematic diagram of a fourth circuit for turning on and off high powered components and in which on time is hardware limited.

FIG. 7 is a block diagram of one embodiment of the hardware and software components of a processing unit associated with a see-through, near-eye, mixed reality display unit.

DETAILED DESCRIPTION

Figure 1A:
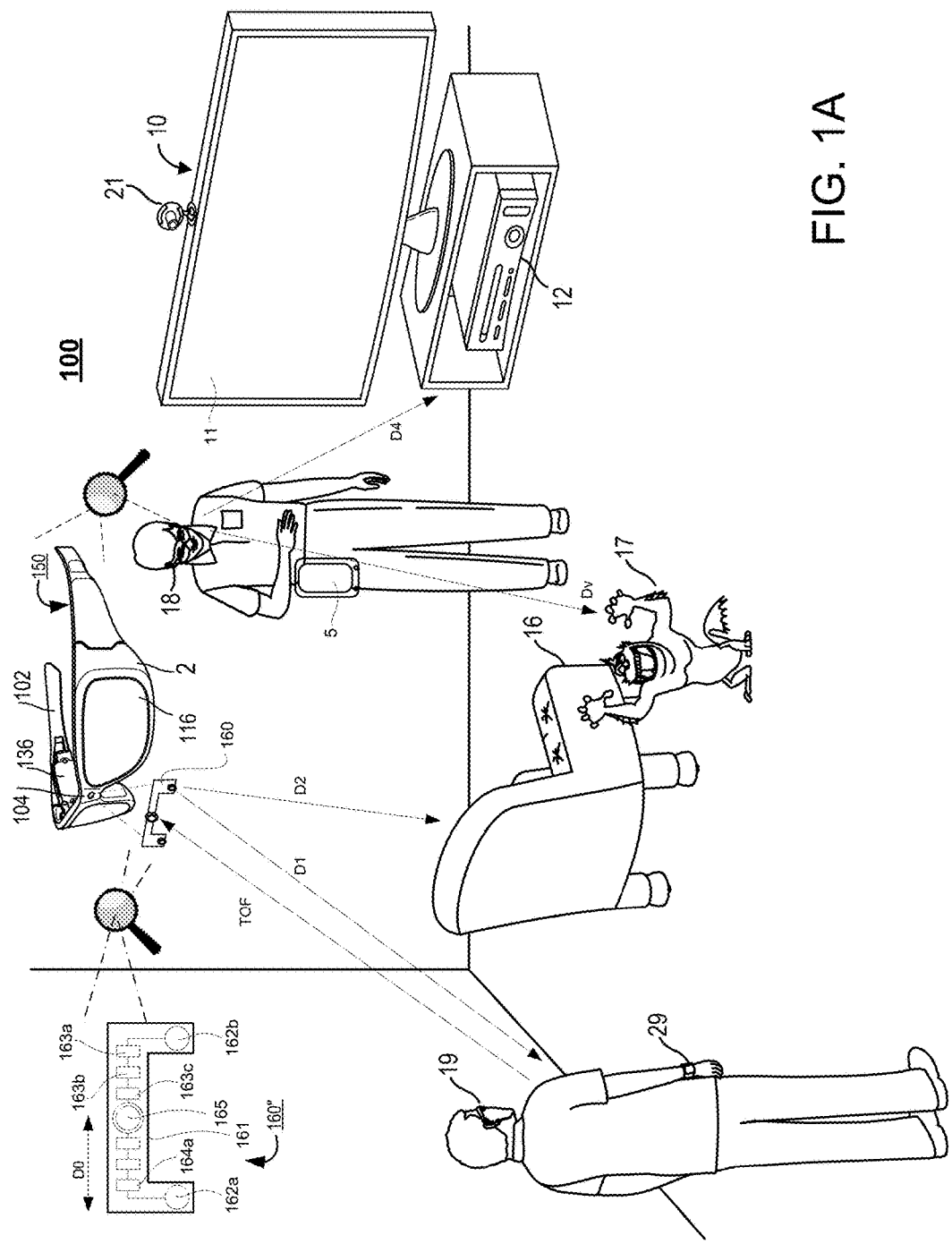
FIG. 1A depicts a see-through HMD embodiment having a TOF sub-system embedded therein for enabling distance determination for real objects in a field of view seen by a user wearing the see-through HMD.

As briefly introduced in the Background section, large power outputting components (e.g., a power MOSFET and its driven load—a laser diode for example) may be closely packed on a printed circuit board (e.g., due to tight timing requirements) and may be controlled by programmably variable digital control means such that some programmable settings can create risk of overheating of either the large power outputting components or nearby other components of the printed circuit board (PCB). More specifically, the large power outputting components may include high power light emitters (e.g., laser diodes) and high power insulated gate switching devices such as IGFET's (Insulated Gate Field Effect Transistors) or MOSFET's (Metal-Oxide-Semiconductor Field Effect Transistors). These may find application in high frequency, high timing resolution systems, for example in Time of Photonic Flight determining sub-systems (also referred to as a TOF sub-systems) as used for example in three-dimensional (3D) augmented reality systems.

In one variation, a pulsed photonic energy waveform corresponding to certain repetition frequencies and phases is produced as a series of time-bound bundles of photons with each bundle being output for example in the form of a short duration yet high energy and substantially rectangular pulse of light preferably having steep rising and falling edges in addition to having a relatively narrow pulse width. More specifically, the per pulse, peak plateau width may desirably be on the order of about 50 nanoseconds (ns) or less as an example while the leading and trailing pulse edges of the pulse each desirably occupy no more than about 10 ns. The time it takes for the output pulses of photons to leave their emitter, travel through air to a reflective target and return to an appropriately sensitized sensor is referred to as the Time of Flight (TOF). Distance between the emitter/sensor pair and the target can be calculated as being TOF*C'/2 where C' is the speed of light in the transmission medium (e.g., air). Interference can be reduced and measurement resolution can be improved by modulating the phases and waveforms of the pulse trains and by relying on the timings of the leading and trailing pulse edges. Optimal waveshapes and timings may be heuristically derived by way of software-based digital control of such parameters. However, software control may allow for unintended damage to high powered components due to risk-increasing settings of pulse widths and/or of temporal spacings between the pulses.

Specific examples of systems in which a TOF sub-system may be embedded include mixed-reality Head Mounted Display (HMD) systems in which the TOF emitter/sensor pair is mounted on a stand alone HMD and used for measuring distance between the user's head and HMD pointed-to real objects that are both near and far away in the user's immediate surroundings. These measured distances are then used by appropriate data processing means (e.g., on-board and/or external electronic signal processing means) to construct in real-time a three-dimensional (3D) mapping of real objects surrounding the user. The mapped real objects are modeled as existing in an XYZ reference frame where Z is depth distance between the user and an in-field-of-view XY plane orthogonal to the Z direction. The frame may be filled with real objects and one or more superimposed virtual objects. An illusion of 3D stereoscopic vision may be created by using a differentiated pair of see-through binoculars where there is a separate, electronically-driven and optically superimposing imaging sub-system for each of a user's two eyes when viewing an augmented reality scene. The term Augmented Reality (AR) is used to refer to displaying an augmented real-world environment where the perception of the real-world environment (or image data representing the real-world environment) is augmented or modified with addition of computer-generated virtual image data. An AR environment may be used to enhance numerous applications including single or multi-user real-time video gaming, real-time mapping, navigation, and various real-time mobile device applications.

When a TOF sub-system is to be used for providing high resolution distance measurement (e.g., on the order of centimeters) over a wide range of distances it is desirable to have: (1) high powered pulses of photonic energy of an appropriate wavelength (e.g., outside the visible spectrum); (2) very steep leading and trailing pulse edges (e.g., less than 10 ns each); (3) precise synchronization between the electronic drive signals of the optical energy emitter (e.g., an IR laser diode) and the optical return sensor (e.g., an IR sensing, gate-able CCD array of pixels); (4) flexibility in defining waveforms of the high powered pulses of photonic energy and (5) longevity and reliability for high powered components that produce the high powered pulses of photonic energy. Unfortunately, when flexible software control is allowed for digitally controlling power MOSFETs that drive the high powered optical energy emitters (e.g., one or more IR laser diodes driven at 0.5 Amperes or higher per pulse) to thereby supply high powered pulses of photonic energy, the flexibility can also allow for unduly prolonged turn on of the power MOSFETs and/or high powered optical energy emitters or unduly short off times between the pulses such that overheating can occur and damage the high powered components and possibly damage nearby other components of the TOF sub-system.

FIG. 1A presents an exemplary environment 100 in which a see-through head mounted display device (st-HMD) having a TOF sub-system embedded therein is used for enabling distance determination for real objects in a field of view seen by a user wearing the see-through HMD.

More specifically, FIG. 1A schematically depicts a multi-user environment 100 in which a first user 18 wears a respective first head mounted device (shown magnified at 150) and sees by way of partial see-through functionality of the HMD 150 an augmented reality surrounding that includes both real objects and virtual objects. The real objects may include a chair 16, a hub computing system 10 and a wide sized display 11 disposed relatively close to the first user 18. A real second user 19 is depicted as being positioned farther away from the first user 18. The virtual objects in the augmented reality surrounding may include a virtual monster 17 which is three-dimensionally positioned in front, behind and/or between various ones of the real objects and differently relative to the two users. For example, computer generated image data may cause the virtual monster 17 to appear as overlaid besides the real chair 16 when perceived through selective see-through lenses of the first HMD 150. The second user 19 may wear his own and respective second HMD and perceive things differently based on relative distances between himself and real and virtual objects within the augmented reality environment 100. In the illustrated example, a first distance between the worn first HMD 150 of the first user 18 and the second user 19 is denoted as D1. A second distance between the worn first HMD 150 and the real chair 16 is denoted as D2. A third distance between the worn first HMD 150 and the virtually superposed monster 17 is denoted as Dv while a fourth distance between the worn first HMD 150 and a real furniture stand on which real display 11 is mounted is denoted as D4.

A Time of Flight (TOF) sub-system 160 is mounted to an upper frame portion of the HMD 150 and used for determining in real-time the various real distances (e.g., D1, D2, D4) between the first user's head and surrounding real objects. The determined real distances may be used in combination with determined head orientation to electronically construct in real-time a three-dimensional (3D) mapping of real objects surrounding the user. The latter data is then used to electronically construct in real-time a stereoscopic image of the virtually superposed monster 17 as appropriately sized and positioned relative to the viewable other objects in the mixed reality environment 100. User experience and a sense of realism may be enhanced when the various real distances (e.g., D1, D2, D4) are accurately determined. In one embodiment, the various real distances (e.g., D1, D2, D4) determinable by the Time of Flight (TOF) sub-system 160 are in a range of 1 foot away from the corresponding HMD (e.g., 150) to 30 feet away from the corresponding HMD. In one embodiment, the various real distances determinable by the TOF sub-system 160 are in a range of 6 inches away from the corresponding HMD to 50 feet away from the corresponding HMD.

The illustrated hub computing system 10 may include a computing apparatus 12, one or more reality capturing devices 21 (e.g., which may have their own TOF sub-systems—not shown), and a display 11, all in wired and/or wireless communication with each other as well as with a computer network (not shown). The reality capturing devices 21 of the hub computing system 10 may operate in time multiplexed cooperation with the TOF sub-system 160 of the HMD 150. More specifically, the HMD TOF sub-system 160 may output a digitally-defined burst of scenery strobing first pulses during first time periods that are relatively short (e.g., 1/300th of a second per burst) followed by long stretches (e.g., 1/30th of a second per stretch) of no strobing. The reality capturing devices 21 of the hub computing system 10 may automatically determine when the non-strobing periods of the in-scene HMDs occur and may output their own strobing pulses during those times. The scenery strobing pulses of the respective devices 21 and 150 may be PWM coded and/or may occupy different portions of the electromagnetic spectrum.

The illustrated computing apparatus 12 may further be in wireless communication with an additional data processing device 5 (e.g., smartphone, touch tablet etc.) worn by the first user 18 where that worn data processing device 5 is in wired and/or wireless communication with the worn first HMD 150. In one embodiment, one or more of the users may further wear a so-called, smartwatch 29 which has its own data processing resources and is in wireless communication with one or more of the local user's additional data processing devices (e.g., with smartphone 5) and/or with the hub computing system 10. The worn data processing devices 5, 29 may contain respective low voltage portable power sources such as those comprising one or more rechargeable batteries (not shown, e.g., each having an output of about 5 VDC or less). In one embodiment, the HMD 150 may include a wireless or wired recharging means (not shown) by way of which its on-board battery (not shown) may be respectively recharged in a wireless or detachably wired recharging manner form one or more of ancillary devices, 5, 29 and 12.

Computing apparatus 12 may include one or more digital and/or analog signal processors as well as corresponding power supplies for powering those processors. Capture device 21 may include a combined color and depth sensing camera that may be used to visually monitor one or more targets including humans and one or more other objects within a particular environment 100. In one example, capture device 21 may comprise an RGB sensing array and an IR or near infrared (NIR) based depth sensing array and computing apparatus 12 may operate as a set-top box and/or as a real time gaming console. As indicated above, the capture device 21 may operate in time multiplexing and/or spectrum multiplexing cooperation with other in-room TOF determining sub-systems (e.g., 160). Additionally, the hub computing system 10 may be in cooperative wireless communication with multiple ones of head mounted displays (only one shown in detail as HMD 150) present in the local environment 100 and/or present in a remote environment (not shown).

As depicted in FIG. 1A, the first user 18 wears a respective first see-through head-mounted display denoted here as 150(1) and the second user 29 may wear his own see-through head-mounted display designated here as 150(2) although not explicitly referenced in the drawing. The worn see-through head-mounted displays, 150(1) and 150(2) may receive virtual data from any of a number of processing devices as described herein, including hub computing system 10, smartphone 5 and/or smartwatch 29 such that a three-dimensional (3D) virtual object (e.g., monster 17) is perceived by each HMD wearing user to exist within a respective field of view as displayed through the respective HMD. For example, as seen by user 18 through his see-through head-mounted display 150(1), the virtual object 17 is displayed as pointing its backside toward first user 18. As seen by second user 19 through his see-through head-mounted display 150(2), the virtual object 17 is displayed as facing toward that second user 19 and standing closer to the second user 19 than the real chair 16.

Referring to the magnified depiction 160" of the embedded TOF sub-system 160 of the first HMD, in one embodiment, the TOF sub-system 160 is formed on a C-shaped multilayer printed circuit board (PCB) 161 that sports a combination RGB and IR/NIR camera 165 at its center and a plurality of high powered laser light emitters (e.g., IR and/or NIR laser diodes) such as 162a and 162b near the terminal ends of the legs of its C-shaped configuration. In one embodiment, the C-shaped printed circuit board (PCB) 161 has ten or more conductor layers spaced apart from one another by interposed dielectric layers. The positioning and/or angling of the respective laser light emitters (e.g., 162a, 162b) may provide for a wider pulse strobed illuminating (in the IR and/or NIR bands of the user's surrounding than might be possible or practical with just a single, center mounter laser light emitter (not shown). In one embodiment, there are at least four such laser light emitters on the PCB 161. The laser light emitters (e.g., 162a, 162b) may each comprise one or more high power laser diodes connected in various series and/or parallel electrical connection configurations. Depending on the characteristics of the on board laser light emitters, different drive voltages may be called for by way of which the laser light emitters are pulsed ay high current levels and thus at corresponding high power levels. One or more on board, voltage boosting circuits (not shown, see 169" of FIG. 1B) may be provided for generating regulated voltages of respective values greater than that of the on-board portable battery or batteries; for example for powering the high power laser diodes. In one embodiment, the in HMD regulated voltage supplies include a 3.0 VDC supply, a 5.0 VDC supply and a 7.5 VDC supply. In one embodiment, a half length D0 of the illustrated C-shaped PCB 161 is about 2.1 inches and each extension leg thereof is about 1.0 inch long such that there is an electromagnetic signal propagation length of about 3 inches between the centrally disposed camera 165 and each of the terminally disposed laser light emitters, e.g., 162a, 162b. The terminally disposed laser light emitters 162a, 162b can be, but do not necessarily need to be of a same kind. They alternatively could have different optical output wavelength spectrums and/or they can point out from the forward major face of the PCB 161 at different 3D directed angles. In one embodiment, the terminally disposed laser light emitters 162a, 162b are angled to provide a 120 degree wide strobed illumination of the user's field of view. Although just two such laser light emitters 162a, 162b are shown in FIG. 1A, other embodiments may comprise a greater number of light emitters having respective optical output power capabilities, respective optical output spectrums and/or respective axes of optical output distribution and room-sweep capability (e.g., more than 120 degrees laterally and/or vertically). The optical output distributions need not be circular and instead could be multi-polar or otherwise configured.

Although not shown in FIG. 1A, metallic heat sinks may be provided at the backsides of the PCB 161 where the high powered laser light emitters 162a, 162b (e.g., IR/NIR laser diodes) are disposed so as to provide for cooling of the light emitters 162a, 162b after each respectively outputs a respective burst of light pulses. The heat sinks may be operatively coupled to air vents that are thermally isolated from the user's head. In one embodiment, the light emitters 162a, 162b alternate between each outputting a 3.33 millisecond (ms) burst of about 10,000 pulses and then being shut off for about 30 ms or longer. In one embodiment, each pulse has a peak current magnitude of about 0.5 Amperes or more (could be as high as 20 A) and a pulse width in the range of about 5 ns to 23 ns, where the 3.33 ms long train of output optical pulses is followed by a no-output period (no-strobing period) of about 30 ms to thereby complete a ⅓₀th of a second frame period. A different one of the laser light emitters on the HMD may provide its output train of optical pulses in the next frame and so on, such that each on-HMD laser light emitter has a relatively long time to cool off after outputting its burst of high energy pulses. Other TOF sub-systems present within the environment 100 (e.g., those of capture devices 21) may output their own scenery strobing pulses during the no-strobe periods of the HMD-mounted light emitters (e.g., 162a, 162b). The no-output period of about 30 ms per frame may be used for data processing purposes and/or to refresh on-board voltage boosters including those that power the high power light emitters 162a, 162b with a voltage level greater than that of the on-HMD board battery or batteries (e.g., greater than 1.5 VDC, greater than 3.0 VDC or greater than 4.5 VDC).

Although thermal heat sinks and relatively long cooling off periods may be provided for the respective high powered light emitters (e.g., 162a, 162b) it is still possible through inadvertency in software control for the configuration of the pulse width modulated (PWM) drive signals of the high powered light emitters and/or of their direct driving switching elements (e.g., IGFETs) to be set such that these high powered components overheat and are themselves damaged and/or damage nearby other components. In particular, when a relatively small sized and components packed PCB 161 is used, heat sensitive other components may come to be laid-out relatively close to the high powered ones (e.g., light emitters). It is thus desirable to avoid overheating in the physical neighborhood of the high powered components. Because system control is generally digital in nature, a natural inclination might be to test the digital control signals in some complex fashion for adherence to a complex set of rules that prevent overheating. However, the TOF determining sub-system (e.g., 160) may need to be kept small in size, lightweight, of low cost, have a low power consumption, and not be encumbered by excessive signal propagation delays, particularly when embedded as part of a stand-alone (untethered) head mounted display device (HMD) that itself needs to be small in size, lightweight, of low cost, have a low power consumption, and not be encumbered by excessive signal propagation delays. Accordingly, complex digital testing of the digital control signals may not produce a practical, low cost way of preventing overheat damage. An analog based method of doing so will be described below.

For sake of better understanding of possible constraints, one embodiment is described here wherein each 3.33 ms long train of high powered output optical pulses is subdivided into 0.022 ns long repeat intervals where the number of pulses in each repeat interval and the placements of the leading and trailing edges of those pulses in the repeat interval is flexibly digitally controlled by means of software, for example to a precision of around 50 picoseconds (85 picoseconds in one embodiment). For example it may be desirable to produce within the repeat interval, a predetermined number of pulses each having a peak plateau width of about 6 ns, a leading edge rise time of about 3 ns or less and a trailing edge fall time of about 10 ns or less. The specific waveform created by the programmably established pulses of the repeat interval and the phasing of the pulses in that interval may be heuristically varied to improve signal-to-noise performance and to minimize interference from undesired higher order harmonics. However, in heuristic varying of where each pulse goes and how wide each pulse, it may come to be that two or more medium width pulses are too close together and have the overheating effect of one unduly wide pulse or it may come to be that the software inadvertently commands the production of one unduly wide pulse that results in or increases the risk of an undesirable overheating condition whereby the light emitter is damaged or suffers a permanent change to its operating characteristics and/or whereby a switching device (e.g., power MOSFET) that directly drives the light emitter is damaged or suffers a permanent change to its operating characteristics and/or whereby nearby other components are damaged or suffer permanent changes to their operating characteristics. Any of these outcomes is undesirable because, for example, they interfere with optimal operation of the TOF determining sub-system (e.g., 160) and/or with optimal operation of other nearby sub-systems; including for example by increasing power consumption and/or reducing accuracy.

In addition to the light emitter drivers, there is a second class of digitally controlled circuitry within the system. At substantially the same time as the software-defined pulse train is output from the then utilized light emitter (e.g., 162a), digital shutter control pulses are propagated to and applied to an IR and/or NIR sensor array of the camera 165 so as to digitally operate an integrated, electronic shutter mechanism of the camera 165 (e.g., a CCD based charge collection limiting mechanism). The shutter control pulses may drive a voltage bias terminal of the camera 165 and may thus control a light sensitivity and pulse discriminating attribute of the camera 165. More specifically, if the target real object (e.g., chair 16) is relatively close to the user and highly reflective, then the return trip light pulses will come back relatively strong and timed to be near the beginning of a sensing period that might additionally be filled with noise and artifacts. In such a case, the shutter is preferably operated at low sensitivity and is caused to be shut closed soon after the beginning of the sensing period so as to block out the noise and artifacts but to capture the leading and/or trailing edges of selected ones of the returned pulses of photons of the short TOF scenario. On the other hand, if the target real object (e.g., second user 19) is relatively far from the first user 18 and poorly reflective, the return trip light pulses will come back relatively weak and timed to be near the end of the return light sensing period. In that case, the camera shutter may be operated at high sensitivity and as shut closed at the beginning of the sensing period while open near the end. In other words, the shutter mechanism may be variably and digitally operated under control of software to compensate for the different return light possibilities, for example by being open for only a short period of time near the front end of the return light sensing period and by being open for a longer time near the tail end of the return light sensing period so as to avoid oversaturation from too bright of return light from nearby reflective objects and so as to avoid too low of a sensitivity for weak return light from far away and less reflective target objects.

The timings and magnitudes of the electronic shutter pulses as applied to the centrally mounted camera 165a and the timings of the electronic light emission drive pulses as applied to the terminally disposed light emitters 162a, 162b need to be synchronized to be very close chronologically to one another (e.g., within about 50 ps of one another in one embodiment; within about 85 ps of one another in another embodiment). In one embodiment, a digital reference clock generator (see 163b" of FIG. 1B) is provided in a PCB circuit section 163b located about midway between the camera 165 and a first (e.g., 162b) of the light emitters. A first electromagnetic signal propagation time delay is experienced by electrical signals traveling from PCB circuit section 163b to a more terminal PCB circuit section 163a near the first (e.g., 162b) light emitter. A second electromagnetic signal propagation time delay is experienced by electrical signals traveling from PCB circuit section 163b to a more central PCB circuit section 163c near the camera 165. The first and second electromagnetic signal propagation time delays may vary as functions of temperature, fabrication process (including change to device physics due to post manufacture overheating), voltage and/or other system parameters. One or more variable time delay elements are provided on the PCB 161 to compensate for these variation effects and to assure that the camera 165 receives its shutter control pulses (not shown in FIG. 1A, see instead 123a", 123b" of FIG. 1B) at substantially the same time (e.g., on a 50 ps resolution level) as the light emitter (e.g., 162b) receives its waveform of laser drive pulses (not shown in FIG. 1A, see instead 121" of FIG. 1B). FIG. 1A additionally shows that other PCB circuit sections such as 164a may be interposed between the centrally mounted camera 165 and light emitters (e.g., 162a) disposed at the other terminal end of the printed circuit board (PCB) 161. As mentioned, there can be more than two laser light emitters and they may be disposed elsewhere on the PCB 161. A respective different time delay may be needed for each of the differently disposed light emitters.

While not detailed in FIG. 1A, it is to be understood that the circuitry of PCB 161 may be in operative wired and/or wireless communication with other parts of the head-mounted display (HMD) 150 including for example with regulated power supplies (e.g., 3.0 VDC, 5.0 VDC) disposed elsewhere in the HMD, with a serial and/or parallel communication port disposed elsewhere in the HMD, with digital processors and/or other control circuitry 136 disposed elsewhere in the HMD. Alternatively or additionally, an electrical cable may be detachably operatively coupled to a worn further module such as smartphone 5 where the latter serves as a battery-powered low voltage power recharging supply for the HMD and as a temporary communication mechanism for coupling to the computing hub 10 and/or directly to the internet or another form of network. Wireless communication as between the head mounted display device (HMD) and the computing hub 10 and/or directly to with internet or with another form of network is also contemplated.

Figure 1B:
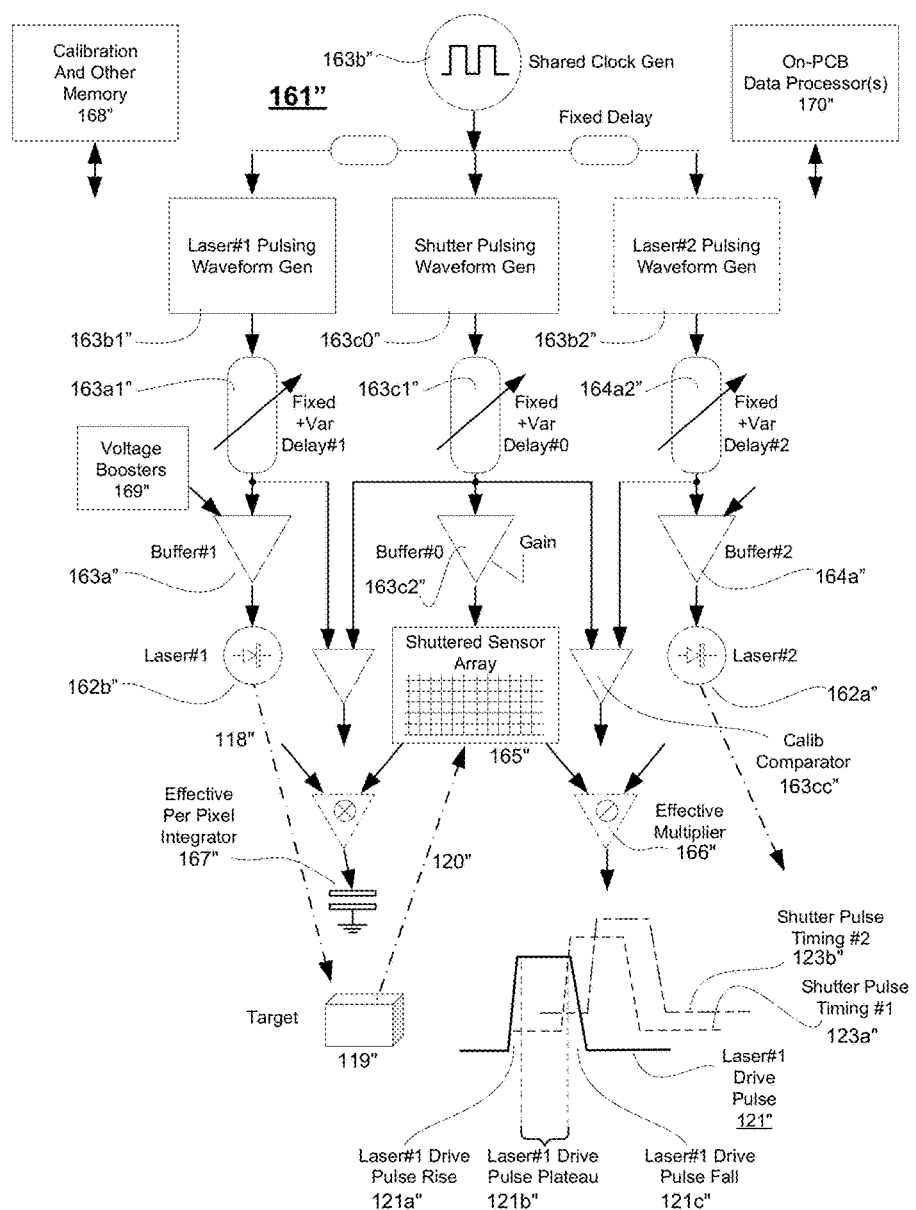
FIG. 1B is a schematic diagram organized to show a signal propagation race through physical space between signals used to drive the light emitters of FIG. 1A and signals used to gate light sensors of FIG. 1A.

Referring next to FIG. 1B, provided here is a schematic diagram organized to show how various electrical signals may propagate about the physical layout of a printed circuit board (PCB) 161" similar to that 161 of FIG. 1A. Not all of the elements shown in FIG. 1B are necessarily provided on the PCB 161 of FIG. 1A. Some of the structure of FIG. 1B is shown for sake of symmetry and easier understanding. This will be made clearer as the details of FIG. 1B are described below. The purpose of FIG. 1B is to show the correspondence between physical layout, component function, delays encountered by signals used to drive the light emitters (e.g., 162a", 162b"), delays encountered by the signals used to gate the light sensors (e.g., IR sensitive pixels) of the camera sensor array 165" mounted at its respective position on the PCB 161" and the variable delays that may be used to bring shutter and light emitter drive signals into very close temporal alignment with one another (e.g., within about 50 ps of one another).

A reference clock generator 163b" is preferably disposed physically close to the camera array 165", for example in PCB area 163b of FIG. 1A. Immediately adjacent to the reference clock generator 163b", for example in PCB area 163c of FIG. 1A, there is provided a shutter pulsing waveform generator 163c0". In one embodiment, the shutter pulsing waveform generator 163c0" is a digitally controlled one and also serves as a laser pulsing waveform generator, thus obviating the need for blocks 163b1" and 163b2" where the latter are in that case replaced by short circuiting PCB traces. This explains part of what was meant above by not all of the elements shown in FIG. 1B being necessarily also provided on the PCB 161 of FIG. 1A. Alternatively, the shutter pulsing waveforms output by waveform generator 163c0" are custom tailored to how it is desired to drive a sensitivity shuttering aspect of the shuttered sensor array 165" (e.g., a CCD array) and in that case, one or both of the further illustrated, laser pulsing waveform generators, 163b1" and 163b2" are provided for separately defining the train of pulses that respectively drive laser light sources 162b" and 162a". In one embodiment, the laser number 1 (#1) pulsing waveform generator 163b1" is physically disposed in PCB area 163b of FIG. 1A and immediately adjacent to the shared reference clock generator 163b". In one embodiment, the Laser#1 pulsing waveform generator 163b1" is digitally programmable, includes a tapped delay line with 85 picoseconds apart delay elements (or other small delay lengths, for example having 50 ps delay elements) and a digitally controlled multiplexer and thereby allows for the generating of customized pulses including those having a rising edge duration of about 1 ns or less, a level plateau width of about 5 ns or more and a falling edge duration of about 1 ns or less. These may be used to drive a high voltage/high current light source driving buffer 163a". Due to parasitic capacitances present within the high voltage/current light source driving buffer 163a", the actual rise and fall times of electrical signals driven through the laser light source 162b" may be larger. More specifically, the falling edge duration of the electrical signals driven through the laser light source 162b" may be undesirably long, for example, longer than 10 ns. Such prolonged leading and/or trailing pulse edges may undesirably contribute to overheating of components. However, the main culprit leading to overheating (or increased risk of such overheating occurring) is the case where individual pulses in the train are each made unduly long (e.g., greater than 50 ns) and/or the off time between immediately adjacent pulses is made too short (e.g., less than 20 ns).

Propagation speeds of electrical signals through conductors and semiconductors tend to be substantially smaller than propagation speeds of photonic signals (e.g., 118" and 120") through air. This itself is not a problem. However, in order to properly generate the outgoing photonic signals (e.g., 118") and properly process the return photonic signals (e.g., 120") it is desirable that steep rising and falling edges be provided in the buffered output signals of buffer 163$a$" (e.g., in laser driving pulse 121") and in the buffered output signals of the shutter operating buffer 163$c$2" (e.g., in shutter driving pulses 123$a$" and 123$b$"). It is also desirable that the relative timing relations between these preferably steep rising and falling edges be controlled to a high level of resolution in spite of variations in system operating temperatures, variations in system fabrication processes (including changes to operating characteristics due to overheating effects) and circuitry layout choices.

To this end, at least one digitally controllable time delay element is provided as having a fine delay resolution (e.g., 50 ps or 85 ps per discrete delay amount) and as interposed between either the Laser#1 pulsing waveform generator 163$b$1" and its corresponding high power Buffer#1 163$a$" or between the Shutter pulsing waveform generator 163$c$0" and its corresponding Buffer#0 163$c$2" or between the Laser#2 pulsing waveform generator 163$b$2" and its corresponding high power Buffer#2 164$a$". For sake of generality, all three of such interposed and digitally controllable time delay elements, 163$a$1", 163$c$1" and 164$a$2" are respectively shown in FIG. 1B. It is to be understood that in addition to having the optionally interposed, digitally controllable time delay elements, there will be some relatively fixed time delaying elements (e.g., PCB traces) in the respective signal propagating paths between the Laser#1 pulsing waveform generator 163$b$1" and its corresponding high power Buffer#1 163$a$"; between the Shutter pulsing waveform generator 163$c$0" and its corresponding Buffer#0 163$c$2"; and between the Laser#2 pulsing waveform generator 163$b$2" and its corresponding high power Buffer#2 164$a$". The fixed delays may vary as functions of temperature, variations in system fabrication processes and circuitry layout choices. One or more calibration processes adjust the at least one included of digitally controllable time delay elements, 163$a$1", 163$c$1" and 164$a$2" to compensate for those variations as well as for non-linearities in control functions. The specifics of such calibration processes are outside the scope of the present disclosure. In one embodiment, one or more calibration comparators (e.g., 163$cc$") are provided on the PCB 161" and each connected for receiving the leading and falling edges of the shutter driving pulses (as input into Buffer#0 163$c$2") and for receiving the leading and falling edges of at least one of the light emitter pulsing trains (as input into Buffer#1 163$a$" or into Buffer#2 164$a$") and for determining when; due to adjustment of the digitally controllable time delay element(s), (at least one of 163$a$1", 163$c$1" and 164$a$2") the received edges are time wise crossing relative to one another. Thereafter, a desired timing relationship between the shutter driving pulses (as input into Buffer#0 163$c$2") and the light emitter pulsing trains (as input into Buffer#1 163$a$" or into Buffer#2 164$a$") may be digitally commanded with use of on or off-board digital controllers and/or data processors 170" and on or off-board calibration parameter storing memories 168" and on or off-board control software stored in on or off-board instruction storing memories such as for example 168".

The one or more calibration comparators (e.g., 163$cc$") of the one embodiment do not, however, detect the timing relations of signals within or output by the shutter driving Buffer#0 163$c$2" and the light source, direct driving Buffer#1 163$a$" and Buffer#2 164$a$". This is so because the calibration comparators (e.g., 163$cc$") operate with low voltage, logic level signals whereas, at least the light source direct driving Buffer#1 163$a$" and Buffer#2 164$a$" operate with relatively higher voltages and/or currents. In light of this, if a design change is to be made to the light source direct driving Buffer#1 163$a$" and Buffer#2 164$a$", that design change should not introduce a significant time delay to signals propagating through the light source direct driving buffer (e.g., 163$a$" and 164$a$") and that design change should not introduce a significant uncertainty as to the timing relationship between rising and falling edges of pulsed signals propagating through the light source direct driving buffer (e.g., 163$a$" and 164$a$").

Such a design change is disclosed herein. However, before it is described in detail, the remainder of FIG. 1B is described for sake of completeness.

The combined effect of the pulsed laser light (e.g., 118") and of the pulsed shuttering of the light sensitive sensor array 165" can be made equivalent to that of effectively multiplying (166") the magnitudes of the overlapping concurrent portions of the respective waveforms of the outgoing and shuttered return light. More specifically, FIG. 1B shows a leading edge portion of a first shutter driving pulse 123$a$" time-wise overlapping a falling edge portion 121$c$" of a direct laser driving pulse 121" where the assumption is that the sensed return light 120" corresponds to the magnitude of the illustrated direct laser driving pulse 121". The magnitude of the first shutter driving pulse 123$a$" can be controlled by a digital Gain control terminal of the shutter driving Buffer#0 163$c$2" so as to accommodate different magnitudes of sensed return light 120". If the first shutter driving pulse 123$a$" is at zero or the direct laser driving pulse 121" is at zero, the result of the effective multiplying of the two is zero. On the other hand, when both are non-zero the multiplication result is integrated and stored in an effective and per-pixel storage means 167" (which can be the CCD wise interconnected light sensing pixels of the array 165"). Time of Flight (TOF) can be determined by sampling many times to improve the signal to noise ratio. The statistical contours of the trailing edges (corresponding to edges 121$c$") of the returned light pulses can be explored by time-wise shifting the leading edges of the shutter driving pulses, for example by modulating between the phases of the first illustrated shutter pulse 123$a$" and that of the second illustrated shutter pulse 123$b$". Conversely, the statistical contours of the leading edges (corresponding to edges 121$a$") of the returned light pulses can be explored by time-wise shifting trailing edges of the shutter pulses when those time-wise overlap with the leading edges of the returned light pulses. Resolution for Time of Flight (TOF) determination can be improved by causing the leading and falling edges of the direct laser driving pulses 121" and of the direct shutter pulsing signals 123" to be as steep as practical.

Additionally, for sake of completeness, block 169" of FIG. 1B is a voltage booster that increases a supplied DC power voltage from say a battery input of between 3 VDC-5 VDC to a regulated voltage of about 7.5 VDC so as to increase the drive power applied to the driven light source (e.g., IR laser diodes 162$a$" and 162$b$"). Item 119" is laser target whose distance from the TOF sub-system is to be determined. In one variation, the respective, digitally adjustable delays of delay elements 163$a$1", 163$c$1" and 164$a$2" are instead integrated into their preceding waveform generators 163$b$1", 163$c$0" and/or 163$b$2" for example by changing the timing along a tapped delay line (part of a DDL not shown, see instead 201 of FIG. 2B) where the leading edge of the first pulse in a repeated train of such pulses appears.

Referring to FIG. 2A, an example of a laser light source driver 201 is now described. A train of substantially rectangular pulses is generated by a digitally controlled, multi-tapped digital delay line (DDL) 201 having a positive feedback element (e.g., amplifying buffer A0) and operating for example with 3V binary signals. The DDL 201 is digitally programmable (and controlled by an on-board memory and/or microcontroller, e.g., 168", 170" of FIG. 1B) such that chronological spacing between each of the pulses (only one shown at 221) in a repeat interval is programmably customizable and such that chronological placement of a leading edge portion 221a of each such pulse 221 is programmably customizable; chronological placement of a trailing edge (e.g., falling edge) portion 221c of each such pulse 221 is customizable and thus width of a peak plateau portion 221b of each such pulse 221 is programmably customizable. Accordingly, and as mentioned above, software instructed varying of where each pulse places on the time line, and how wide each pulse is, may result in production of two or more medium width pulses that are too close together and thus have an overheating effect (or increased risk of overheating) similar to that of one unduly wide pulse or software instructed varying may result in an inadvertent production of one unduly wide pulse that leads to an undesirable overheating condition whereby the light emitter is damaged or suffers a permanent change to its operating characteristics and/or whereby a switching device (e.g., power MOSFET) that directly drives the light emitter is damaged or suffers a permanent change to its operating characteristics and/or whereby nearby other components are damaged or suffer permanent changes to their operating characteristics. Any of these outcomes is undesirable because, for example, they can interfere with optimal operation of the TOF determining sub-system (e.g., 160) and/or with optimal operation of other nearby sub-systems; including for example by increasing power consumption and/or reducing accuracy.

In one embodiment, the leading edge portion 221a of the DLL generated pulse has a rise time of less than 1 ns and the trailing edge 221c has a fall time of about 1 ns or less. The width of the peak plateau portion 221b is controllable in increments as small as about 50 picoseconds to about 85 picoseconds. Thus precise and digitally controlled fine tuning of edge placement is possible. It is within the contemplation of the present disclosure to use other programmable pulse train generators with similar capabilities for coarse and fine chronological placement of pulses and of their respective leading and trailing edges where the edges have such relatively steep rise and fall geometries. The magnifying glass in FIG. 2A points to node N2 and shows in magnification one of 5.0V peak pulses appearing at node N2 as a result of a level shifting function provided by non-inverting amplifier A1.

The illustrated laser light source driver 201 of FIG. 2A further comprises a plurality of bipolar junction transistors (BJT's), Qp3, Qn4 connected in an emitter follower configuration and a power MOSFET Qn7. BJT Qn4 is an NPN transistor while Qp3 is a PNP transistor. The power MOSFET Qn7 is an N-channel device. In one embodiment, all of Qp3, Qn4 and Qn7 are silicon based discrete devices having miniaturized solder bump mount packages with package dimensions on the order of about 1 mm. Thus they consume relatively little space on the PCB 160 (FIG. 1A). It is within the contemplation of the present disclosure to use other semiconductive material technologies for one or more of Qp3, Qn4 and Qn7 such as, but not limited to, III-V compounds such as GaAs and/or nitrides thereof (e.g., GaN), strained lattice SiGe formulations and so forth.

Buffering amplifier A1 connects to a 5V power supply and it level shifts the 3V pulses output by the DDL circuit 201 into 5V pulses. (In an alternate embodiment, the pulses are 4.5V high due to internal voltage drops in amplifier A1.) Complimentary bipolar junction transistors (BJT's), Qp3 and Qn4 form an emitter follower type of driver for the parasitic gate capacitance $C_p$ of the power MOSFET Qn7. The level shifted pulses 221 of the pulse train that is applied to the base terminals of Qp3 and Qn4 has a peak plateau magnitude of about 5 volts. This value is picked to sufficiently drive MOSFET Qn7 into saturation and to compensate for band gap characteristics of the silicon based BJT's, Qp3 and Qn4 of the exemplary embodiment 210. While the base drive voltage at node N2 is 0V before the leading edge of the pulse 221 arrives, if node N3 is above threshold (e.g., 0.6V) Qp3 becomes forward biased and drains the gate capacitance Cp of charge so as to drive the voltage of gate node G7 to below the threshold voltage ($V_{THigfet}$) of the MOSFET Qn7. Thus Qn7 is substantially turned off.

When the leading edge portion 221a of the applied pulse 221 arrives and crosses above around 0.6V, NPN transistor Qn4 is rapidly turned on and is provided with adequate current from the relatively high voltage V7 of the Vboost circuit 207 to charge up the voltage of gate node G7 to the voltage of the applied pulse 221 (e.g., 5.0V) minus the base-emitter forward drop $V_{be4Fwd}$ of Qn4. This voltage is above the threshold voltage ($V_{THigfet}$) of the MOSFET Qn7 and thus Qn7 is rapidly turned on. At the same time, because the voltage on node G7 rises to about 5V and current $i_{gs1}$ into the gate capacitance $C_p$ is diminishing as gate capacitance $C_p$ charges up, the forward bias current from node N2 into the emitter of Qn4 self-extinguishes and Qn4 turns off. Thus power consumption for turning on MOSFET Qn7 is limited to that needed to charge up the voltage of gate node G7 to above the threshold voltage ($V_{THigfet}$) of the MOSFET Qn7.

When the trailing edge 221c of the applied pulse 221 arrives and crosses below the voltage on G7 minus around 0.6V, PNP transistor Qp3 turns on and, as an emitter follower, starts draining gate capacitance Cp of charge so as to drive the voltage of gate node G7 below the threshold voltage ($V_{THigfet}$) of the MOSFET Qn7. Thus Qn7 is substantially turned off.

As mentioned, the collector of NPN transistor Qn4 is connected to a relatively high voltage rail (node V7) which in one embodiment, is generally maintained at about 7.5V by action of a programmable voltage boosting circuit 207 (where in one embodiment, the maintained voltage can be programmably changed). Voltage boosting circuit 207 receives a power input from a lower voltage source, for example an on board regulated 5 VDC source (not shown). As soon as Qn4 becomes forward biased in response to the leading edge 221a of pulse 221, it couples the V7 rail voltage (e.g., 7.5V minus the forward emitter-collector drop, Vec4 of Qn4) to charge the gate capacitance Cp (with current $i_{gs1}$). Voltage at the base B3 of PNP transistor Qp3 rises at least as fast if not faster than voltage at its emitter (node N3) and thus Qp3 is kept reverse biased and turned off. In short, the charging up of the MOSFET gate (G7) simultaneously turns Qn4 first on and then off while Qp3 is kept turned of. When MOSFET Qn7 turns on, a large surge of current flows through light emitting element (e.g., IR laser diode or series of diodes) interposed between the drain terminal D7 of the MOSFET and the V7 node. In one embodiment, the surge has a magnitude of about 0.5 amperes but it could be higher (e.g., as much as 10 A to 20 A in some embodiments) or lower. This surge should have a relatively short duration as long as the width of the drive pulse 221 is on the order of about 50 ns or less (more specifically, about 6 ns in one embodiment). However, it is possible for the digitally controlled DDL circuit 201 to be programmably commanded to output longer pulse widths or very short durations of off time and then the high powered components (e.g., Qn7, Laser#1) may overheat and become damaged by such overheating and/or they may damage nearby other components.

FIG. 2B illustrates a self-synchronizing and low part count modification to the circuitry which reduces the risk of potential overheating in the form of modified light emitter driver 220. As seen, a few extra components, namely, NPN transistor Qn1, resistor R2 and capacitor C1 are inserted in a manner where, if the NPN transistor Qn1 (e.g., a silicon bipolar junction transistor) is switched on, a relatively large first current, $i_{GTTh1}$ is pulled out of level shifting amplifier A1 to support a corresponding current flow $i_{GTTh2}$ moving through the triggered on, NPN transistor Qn1. The level shifting amplifier A1 is designed however, such that its output drops substantially below 5V when attempting to supply the relatively large first current, $i_{GTTh1}$. On the other hand, the level shifting amplifier A1 is designed to provide an output relatively close to 5V when supplying a substantially smaller current $i_{LTTh0}$ merely for forward biasing the base-emitter junction of NPN transistor Qn4. Accordingly, if transistor Qn1 is not triggered into a high current draining mode, the amplifier A1 is able to supply about 5V to the base of transistor Qn4. On the other hand, if transistor Qn1 is triggered into a high current draining mode (one where $i_{GTTh1}$ flows), the amplifier A1 is not able to supply the approximately 5V level, the base-emitter junction of Qn4 becomes reverse biased and Qn4 shuts off. At the same time, PNP transistor Qp3 can become turned on so as to discharge the gate capacitance $C_p$ of the power MOSFET Qn7 and to thus turn off the latter power component.

A magnified exemplary embodiment of amplifier A1 is depicted in FIG. 2B. The exemplary amplifier A1 is composed of an even number of inverters such as the illustrated A1.1 and A1.2. The first inverter, A1.1 is a CMOS inverter powered by the on-board 3 volt power supply (V3). The second inverter, A1.2 is a CMOS inverter powered by the on-board 5 volt power supply (V5) and comprised of an NMOS transistor Qno in cascade connection with a PMOS transistor Qp0. The source of Qp0 connects to the V5 power rail. The drain of Qp0 connects to the drain of Qn0 and to node N2. The source of Qn0 connects to ground. The PMOS transistor Qp0 is sized such that when the output of first inverter A1.1 is low (e.g., at 0V) and Qn1 is below its trigger threshold, PMOS transistor Qp0 can output a forward biasing current $i_{LTTh0}$ for forward biasing the base-emitter junction of NPN transistor Qn4 with relatively small voltage drop (e.g., $V_{dsP0}$<0.5V) between the source (V5) and drain (N2) of Qp0. Additionally, the PMOS transistor Qp0 is sized relative to NPN transistor Qn1 such that if Qn1 is triggered into its high current draining mode, a relatively large voltage drop (e.g., $V_{dsP0}$>2.5V) appears between the source (V5) and drain (N2) of Qp0 when the output of first inverter A1.1 is low (e.g., at 0V), this occurring because the PMOS transistor Qp0 has insufficient current conducting capability (e.g., too small of a channel width) to output the relatively large first current, $i_{GTTh1}$ drawn by NPN transistor Qn1 when Qn1 is triggered into its high current mode. This set of conditions forces the NPN transistor Qn4 to shut off and stop applying approximately 5V to node N3. This in turn causes the power MOSFET Qn7 to turn off or at least switch into a reduced current mode because its gate-to-source voltage (at node G7) is below its saturated operation level. As a consequence, current flow $i_{ds}"$ through the high powered components (e.g., Qn7, Laser#1) decreases and overheating is prevented.

The introduced transistor Qn1 among the added components of the pulse clamping circuit (C1, R2, Qn1) operates as a voltage triggered, switched transconductance device, meaning that it has a predetermined threshold voltage (e.g., ≥1.6V) at and above which it exhibits a relatively large transconductance (here, the ratio of collector current $i_{GTTh2}$ versus base input voltage VN4, where VN4 is the voltage at node N4) and below which predetermined threshold voltage (e.g., <0.6V) it exhibits a substantially smaller transconductance (e.g., a Δi/Δv ratio much less than 10). While in one embodiment, the voltage triggered NPN transistor Qn1 is a silicon transistor having a threshold voltage of around 0.6V (as determined by band gap characteristics of the semiconductive material), it is within the contemplation of the present disclosure to use alternative materials (e.g., Ge, SiGe, GaAs, GaN) which cause the voltage triggered, transconducting device (e.g., Qn1) to have a respective different threshold voltage (e.g., around 0.2V for Ge). It is also within the contemplation of the present disclosure to use devices other than one or more BJT's for the voltage triggered, transconducting device, for example a junction field effect device (JFET) or a Darlington connected set of junction devices (see for example FIGS. 2C-2D as discussed below).

Resistor R2 and capacitor C1 form an analog voltage integrating circuit. While the voltage at node N1 is high (e.g., 3.0V), current flows through resistor R2 to charge up capacitor C1. On the other hand, while the voltage at node N1 is low (e.g., 0V), a discharge current flows through resistor R2 to discharge capacitor C1. Some amount of discharge current can also flow out of capacitor C1 and through the base-to-emitter path of the voltage triggered, transconducting device (Qn1) although this amount can be relatively negligible when VN4 is below threshold. The durations of the charge and discharge modes, as well as the RC time constant provided by the selected values of resistor R2 and capacitor C1 will determine what voltage VN4 develops across capacitor C1. As long as the voltage VN4 across integrator capacitor C1 stays below the predetermined threshold voltage (e.g., 0.6V) of the voltage triggered, transconducting device (Qn1), the transconducting device draws only a negligible amount of current and does not interfere with the operation of the rest of the MOSFET drive circuit 220. However, when the voltage across integrator capacitor C1 reaches or exceeds the predetermined threshold voltage (e.g., 0.6V) of the voltage triggered, transconducting device (Qn1), the transconducting device switches into a relatively high transconductance mode (e.g., a Δi/Δv ratio greater than 10 or better yet greater than 50); conducts a relatively large current $i_{GTTh2}$ (where here GTTh stands for greater than threshold) and thereby interferes with the operation of the rest of the MOSFET drive circuit 220. More specifically, it cause the power MOSFET Qn7 to become turned off (or driven into a mode where it conducts much less drain-to-source current $i_{ds}"$) and thus prevents large currents (ids7 of FIG. 2A) from flowing through the high powered components (e.g., Qn7 and Laser#1).

The added, pulse width limiting components, namely, NPN transistor Qn1, resistor R2 and capacitor C1 can be in the form of miniaturized solder bump mount packages with package dimensions on the order of about 1 mm or less.

Thus they consume relatively little space on the PCB 161 (FIG. 1A) and do not substantially change signal propagation delay through the laser's direct drive buffer circuit 220. The values of resistor R2 and capacitor C1 may be heuristically selected in view of the peak voltages (e.g., 3V) of the pulses output by the DDL 201 and the trigger threshold voltage (e.g., 0.6V) of the voltage triggered, transconducting device (e.g., Qn1) and the maximum pulse width modulation ratio (duration of high levels over duration of low levels plus high levels) to be allowed for the pulses output by DDL 201 over a predetermined time period (e.g., 100 ns or less). In one embodiment, the pulse width clamping circuit cuts off any one single pulse having a pulse width greater than 75 ns. The trigger threshold voltage (e.g., 0.6V) of the voltage triggered, transconducting device (e.g., Qn1) should be less than the peak voltage (e.g., 3V) of the pulses applied to the input (node N1) of the integrator.

FIG. 2B shows a further addition of an inductor RL55 that has a characteristic inductance L5 and an inherent resistance R5. For example inductor RL55 may be of a wire-wound air core type configured for operating at frequencies of about 45 MHz and higher. Inductor RL55 is inserted so as to form an RLC loop when considered in combination with gate capacitance Cp. In one embodiment, the added inductor RL55 is also in the form of a miniaturized solder bump mount package with package dimensions on the order of about 1 mm or less. Thus it consumes relatively little space on the PCB 161 (FIG. 1A) and does not substantially change signal propagation delay through the laser's direct drive buffer circuit 220. In the illustrated embodiment, one terminal of the dual terminal inductor RL55 connects directly to ground (e.g., a wide area ground plane among the plural conductive layers of the PCB 161) while the other terminal connects to node N5. The inductance L5 of the inductor RL55 is used to provide faster discharge of the high gate capacitance Cp of the power MOSFET Qn7. Details of that operation are not wholly germane here. Very briefly, when Qn7 is being turned on, a first current $i_{La}$ flows downward through the inductance L5 and its characteristic resistance R5. When Qn7 is being turned off, a magnetic filed of L5 collapses and an induced second current $i_{Lb}$ flows downward through the inductor RL55 to more quickly discharge gate capacitance Cp.

FIG. 2C illustrates another embodiment 230 of the MOSFET drive buffer. The circuitry is for the most part similar to that of FIG. 2B except that a further NPN transistor Qn2 and respective collector load R24 is added. (In one embodiment, R24 is zero ohms.) Additionally, in one embodiment, an extra non-inverting level shifting amplifier A1a is optionally interposed between the 3V output of the DDL 201 and node N2 where the pulsed peak output voltage of optional level shifting amplifier A1a is determined by output stage voltage source Va and can be set for example to 4.5V or 5.0V or another such value greater than 3.0V. In an alternate embodiment, level shifting amplifier A1a is not present and second amplifier A1b alone provides the level shifting from the 3.0V binary signals output by the DDL 201 to the 5.0V binary signals used at node N2. The further NPN transistor Qn2 is inserted Darlington pair style between the emitter of NPN transistor Qn1 and ground such that the emitter current of Qn1 becomes the base current of Qn2. Thus a higher transconductance may be triggered when the threshold voltage (e.g., 0.6V+0.6V=1.2V) of the combination is reached. In yet another embodiment (not shown), one or more Si and/or Ge diodes are inserted between the emitter of BJT Qn2 and ground so that, depending on what the Va voltage is of level shifter A1a, the threshold voltage becomes $0.6V+0.6V+(n*0.6)+(m*0.2)=V_{th}>1.2V$ where n is the number of additionally inserted silicon diodes (or further Darlington connected silicon BJT's) and m is the number of additionally inserted Ge diodes (or further Darlington connected Ge BJT's). Given that the threshold voltage for triggering the voltage triggered, transconducting combination of Qn1 and Qn2 (plus further cascaded in diodes or BJT's—not shown) is the sum of the base-to-emitter threshold voltages of the series connected devices, for example 0.6V+0.6V=1.2V, it is within the contemplation of the present disclosure to use other semiconductive materials (e.g., Ge, SiGe, GaAs) and/or mixes of different devices (e.g., BJT and JFET) for obtaining respective different threshold voltages for triggering the switch over into the high transconductance mode and/or other material and device type behaviors (e.g., relative to temperature variations). In one embodiment, resistor R24 may be eliminated and the collector of Qn2 may be connected to the collector of Qn1. In an alternate embodiment, resistor R24 may be replaced by or provided in series with a reactive network such as one including an inductor (see L24 of FIG. 2D) where that added reactive network (e.g., inductor) may be magnetically coupled to L5 such that when Qn2 is turned on, a current flow is induced in L5 for rapidly discharging the gate of MOSFET Qn7. Of course all these circuitry complicating additions disadvantageously add to the parts count and cost of the system whereas the driver 220 of FIG. 2B is less complicated and adds fewer parts while achieving relatively good results.

Referring to the driver embodiment 240 of FIG. 2D, and as explained above, in one variation resistor R24 is replaced by inductor L24 (which could have its own characteristic series resistance (not shown where there is mutual inductive coupling m524 between inductors L24 and L5. When the voltage triggered, transconducting combination of Qn1 and Qn2 is switched on, current $i_{GTTh4}$ begins to flow through inductor L24. This induces a gate discharging current $i_{Lb}$ to flow through inductor L5. If the combination of Qn1 and Qn2 is not switched on, then current $i_{GTTh4}$ does not flow. On the other hand, if a first current $i_{La}$ is passed into inductor L5 to build a magnetic field thereof when NPN transistor Qn4 turns on, a positive EMF is induced across L24 and is polarized toward shutting off or keeping off PNP transistor Qp3. Thus the mutual inductive coupling m524 does not have detrimental effect on the desired circuit operation.

Figure 3A:
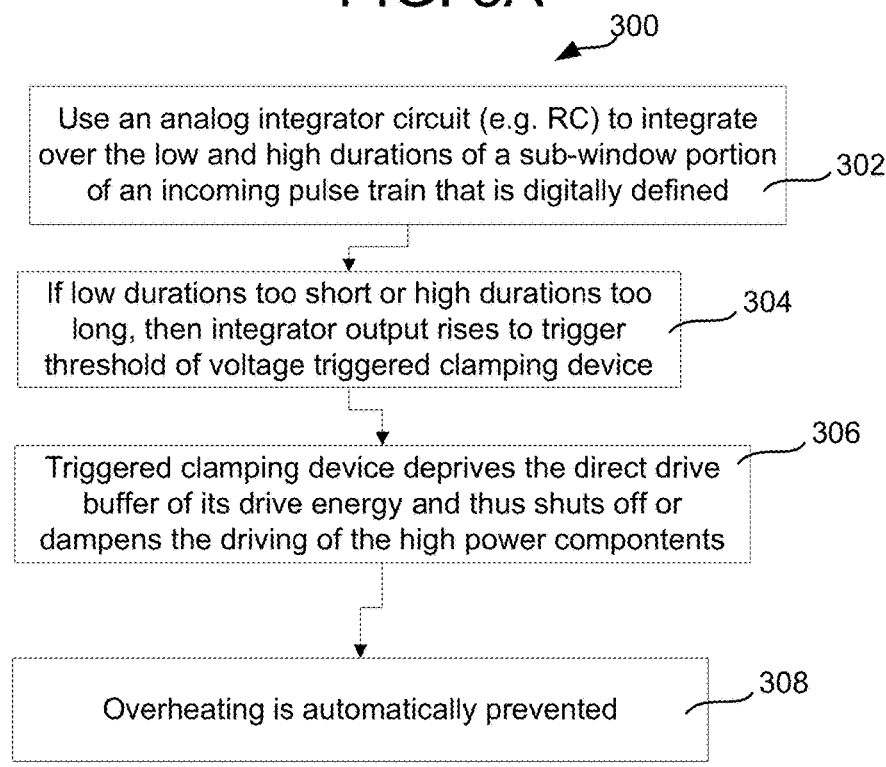
FIG. 3A is a flowchart explaining a process by way of which an analog limit may be placed on digitally defined pulse widths and spacings.

FIG. 3A is a flow chart showing a sequence of events 300 in which a pulse width clamping circuit such as that of FIGS. 2B and 2C employs analog processing to place a limit on high power output due to digitally defined pulse widths and spacings between the pulses. At step 302, an analog integrator circuit (e.g. a simple RC integrator) is used to integrate over the low and high durations of a sub-window portion of an incoming pulse train that is digitally defined. The temporal length of the sub-window portion is less than that of the full pulse train (e.g., less than 4 ms) but long enough to detect and cut off an overheating possibility due to even a single pulse whose turn-on duration is unduly long (e.g., more than 75 ns) such that overheating may occur (or risk thereof is increased) in one or more of the driven high powered components (e.g., Qn7 and Laser#1). The analog integration sub-window portion will also catch two more pulses that are each relatively short in duration but are at the same time spaced so closely together so as to create an overheating possibility.

Step 304 depicts the combination of possibilities where clamp down should be triggered. More specifically, if low durations in the integration time window (sub-window) are too short and/or one or more high durations are too long, then the integrator output (e.g., VN4 of FIG. 2B) rises to the trigger threshold of the voltage triggered clamping device (e.g., Qn1 of FIG. 2B) and accordingly causes the voltage triggered clamping device to rapidly switch from a non-clamping mode into a clamping mode. More specifically, in the case of Qn1 of FIG. 2B, while the voltage across capacitor C1 is below threshold (e.g., 0.6V), NPN transistor Qn1 conducts no more than negligible amounts of leakage current in its collector-to-emitter path and in its base-to-emitter path. However, once the threshold voltage (e.g., 0.6V), of NPN transistor Qn1 is reached, a substantially larger collector-to-emitter current $i_{GTTh2}$ flows through NPN transistor Qn1 and as part of the current flowing through amplifier MOSFET Qp0. The current through amplifier MOSFET Qp0 becomes sufficiently large so that a relatively large voltage drop is induced between its source terminal (V5) and its drain terminal (N2). As a result the base drive voltage $V_{N2}$ at node N2 drops significantly. As a consequence, at least NPN transistor Qn4 is turned off and thus stops supplying a field maintaining current $i_{La}$ to inductor L5. The magnetic field of inductor L5 begins to collapse and therefore induces a gate discharging current out of the gate of power MOSFET Qn7. Thus Qn7 is quickly turned off. Damage due to overheating is prevented. Even in an alternate case where the RL55 inductive circuit is not present, the turn off of Qn4 and the turn on of Qn1 brings the base voltage $V_{B3}$ of PNP transistor Qp3 below that of its emitter ($V_{N3}$) and thus turns on Qp3 for draining the charge out of gate capacitance Cp to thereby turn off MOSFET Qn7 or to at least substantially reduce its current output $i_{ds}$". Thus damage due to overheating is prevented or substantially reduced and device longevity is increased.

Step 306 depicts some possible consequences of the voltage triggered clamping device (e.g., Qn1 of FIG. 2B) being switched from a non-clamping mode into a clamping mode. Even if the clamping device (e.g., Qn1 of FIG. 2B) fails to fully turn NPN transistor Qn4 off, the triggered on clamping device (e.g., Qn1 of FIG. 2B) deprives NPN transistor Qn4 of base voltage and/or base-to-emitter current and thus lessens the amount and/or rate of charge that NPN transistor Qn4 can deliver into the gate capacitance Cp of the power MOSFET Qn7. Thus, at minimum, Qn7 is not switched on into a fully saturated mode when the clamping device (e.g., Qn1 of FIG. 2B) is triggered on and this dampens the amount of power applied to the high powered components (e.g., Laser#1, Qn7). Therefore the risk of permanent damage due to overheating is automatically lessened (Step 308).

Although FIGS. 2B-2D and 3 are directed to a single combination of an IGFET driven laser emitter and a corresponding fast charge and discharge drive circuit for the one IGFET, it is to be understood that the PCB 161 of FIG. 1A (for example) can have two or more such combinations mounted thereon and thus the circuitry of one or more of FIGS. 2B-2D and the method of FIG. 3A can be many times repeated on the PCB without unduly adding many large components to the PCB and without causing significant temperature dependent variation of signal propagation delays due to the addition of the clamping circuitry (e.g., transistor Qn1, resistor R2, and capacitor C1 of FIG. 2B) and/or due to the addition of the inductive circuitry (e.g., inductor RL55 of FIG. 2B) into the direct-to-laser driving buffer (e.g., 163a" of FIG. 1B). Accordingly, an elegant and small form factor modification is provided for reducing the risk of damage from overheating and optionally also reducing the discharge times of the plural IGFET laser emitter drivers (not all shown) without significantly increasing system weight, cost, size of complexity.

Figure 3B:
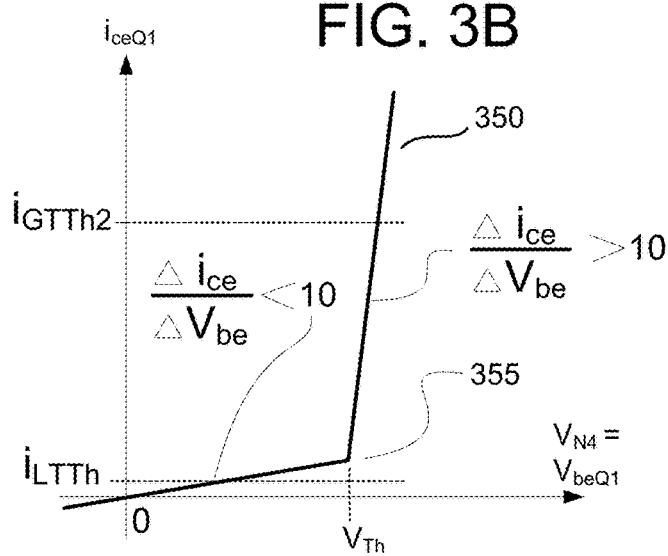
FIG. 3B is a piecewise linear approximating graph that schematically illustrates the change of transconductance of a voltage triggered transconductance device.

FIG. 3B is a piecewise linear approximating graph that schematically illustrates the change of transconductance behavior of a voltage triggered transconductance device. As illustrated, the voltage triggered transconductance device has a knee (e.g., inflection point) 355 in its transconductance characteristic curve 350 at a predetermined threshold voltage Vth, where below the threshold voltage Vth, its transconductance slopes (e.g., $\Delta i_{ce}/\Delta V_{be}$, only one shown where instead there can be a first range of such slopes) are relatively small (e.g., less than 10 and more preferably much less than 1) and where above the threshold voltage Vth, its transconductance slopes (e.g., $\Delta i_{ce}/\Delta V_{be}$, only one shown where instead there can be a second range of such slopes) are substantially larger (e.g., more than 10 and more preferably much larger than 10 such as greater than 50 or 100 or 500 or 1000). It is to be understood that FIG. 3B is merely a schematic approximation and that in practice the transconductance characteristic curve 350 may have a curved exponential or power series form having numerous slopes and may be more complex than the simple two piece approximation shown. The key points are that below the predetermined threshold voltage Vth, a relatively small current $i_{LTTh}$ or essentially no current will flow and thus the voltage triggered transconductance device (e.g., Qn1) will not significantly alter the behavior of the current supplying circuit branch that supplies current for switching on one or more of the high powered components. In the example 220 of FIG. 2B, the current supplying circuit branch is constituted by one or both of the source-to-drain current pathway through MOSFET Qp0 and the base-to-emitter current pathway through bipolar transistor Qn4. On the other hand, when operating above its predetermined threshold voltage Vth, a relatively large current $i_{GTTh2}$ will be drawn by the voltage triggered transconductance device (e.g., Qn1) and thus it will significantly impede an ability of the current supplying circuit branch to supply current for switching on one or more of the high powered components. In the example 220 of FIG. 2B, where the current supplying circuit branch is constituted by one or both of the source-to-drain current pathway through MOSFET Qp0 and the base-to-emitter current pathway through bipolar transistor Qn4, the triggered on transconductance device (e.g., Qn1) causes a relatively large current $i_{GTTh2}$ to flow through MOSFET Qp0 so that the source-to-drain voltage of that MOSFET ($V_{dsQp0}$) significantly increases and the triggered on transconductance device (e.g., Qn1) deprives the base-to-emitter current pathway through bipolar transistor Qn4 of its current so that bipolar transistor Qn4 is driven towards shut off. Additionally, in the example 220 of FIG. 2B, the triggered on transconductance device (e.g., Qn1) can cause a forward biasing, emitter-to-base current to flow through PNP transistor Qp3 to thus turn on the latter device and drain charge out of the gate (Cp) of the power MOSFET Qn7, thus reducing or turning off the current provided by the power MOSFET Qn7. As a result, current through the high powered components (e.g., Qn7, Laser#1) of the circuitry is reduced or turned off and the amount of heat energy produced by these high powered components is commensurately reduced.

An advantage of using a junction type semiconductive device such as bipolar junction transistor (BJT) Qn1 is that its threshold voltage (Vth) is determined by band gap physics and is relatively temperature independent. Thus a relatively small and simple device such as NPN transistor Qn1 can function as the voltage triggered transconductance device. It is within the contemplation of the present disclosure to additionally or alternatively use other devices for forming the voltage triggered transconductance device. For example, a Darlington configuration such as illustrated in FIGS. 2C-2D can exhibit a greater transconductance change about its threshold voltage Vth.

Figure 4:
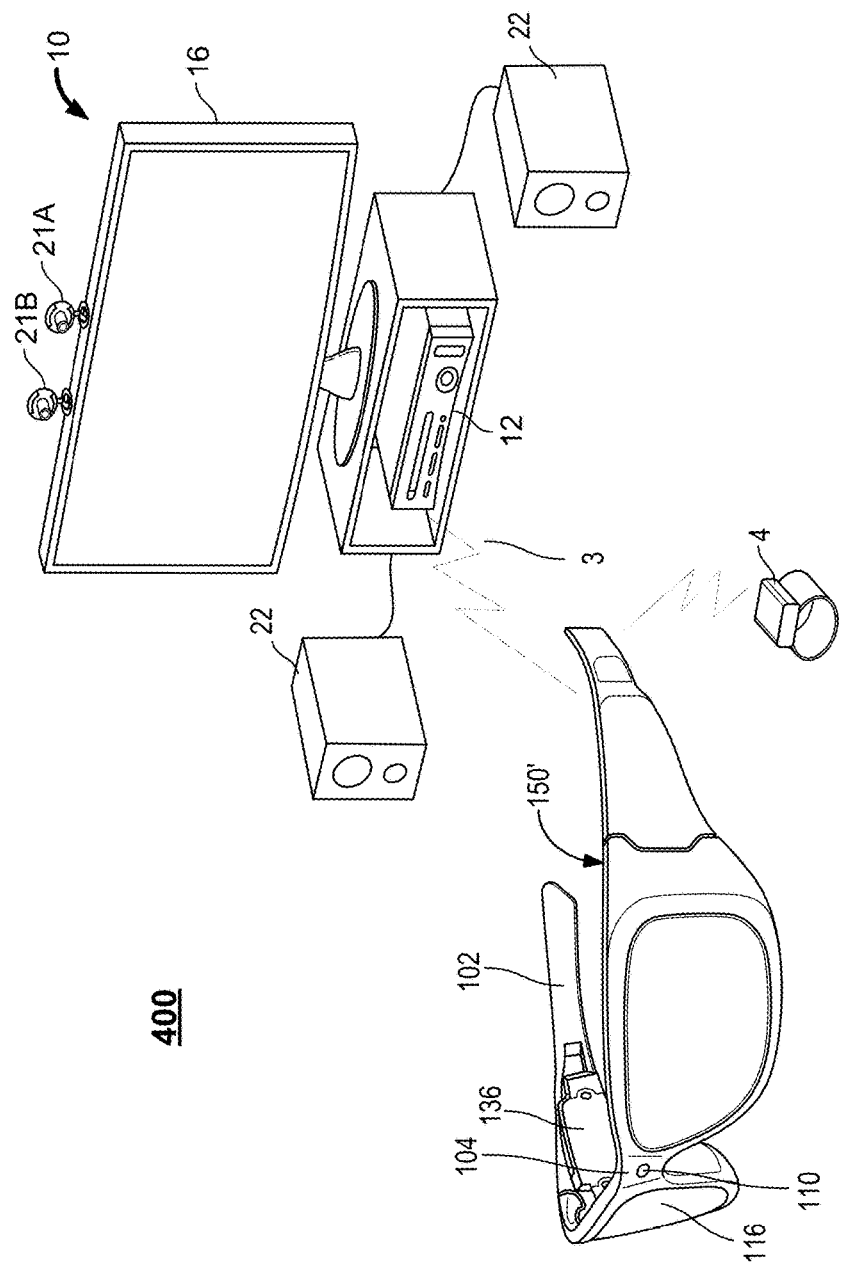
FIG. 4 is a block diagram depicting example components of an embodiment of a see-through, mixed reality display system with an on-board TOF sub-system.

FIG. 4 is a block diagram depicting example components of one embodiment 400 of a see-through, mixed reality display device using the high powered components pulse width clamping aspect of the present disclosure. The illustrated system 400 includes a see-through display device as a near-eye, head mounted display device 150' in communication with a user-worn (e.g., belt-worn, or arm-worn) processing unit 4 via wireless link 3. Head mounted display device 150', which in one embodiment is in the shape of eyeglasses 116 in a frame 102, is worn on the head of a user so that the user can see through a display, embodied in this example as a separate display optical system for each eye, and thereby providing binocular vision including an actual direct view of the space in front of the user.

The use of the term "actual direct view" refers to the ability to see real world objects directly with the human eye through the lenses (e.g., 116) of the HMD 150', rather than seeing only created image representations of such objects. For example, looking through glass at a room allows a user to have an actual direct view of the room, while viewing a video of a room on a television is not an actual direct view of the room. Based on the context of executing software, for example, a gaming application, the system can project images of virtual objects (e.g., monster 17 of FIG. 1A), sometimes referred to as virtual images, on the display that are viewable by the person wearing the see-through display device while that person is also viewing real world objects through the display.

Frame 102 provides a support for holding elements of the system in place as well as a conduit for electrical connections. In this embodiment, frame 102 provides a convenient eyeglass frame as support for the elements of the system discussed further below. In other embodiments, other support structures (e.g., an around the head adjustable band) can be used. An example of such a structure is a visor or goggles. The frame 102 includes a temple or side arm for resting on each of a user's ears. The visible temple side of 102 is representative of an embodiment of the right temple and includes control circuitry 136 for the display device 150'. Nose bridge 104 of the frame includes a microphone 110 for recording sounds and transmitting audio data to processing unit 4. Although not shown in FIG. 4, the C-shaped PCB 161 of FIG. 1A may be mounted just above the microphone 110 so as to allow for unimpeded receipt of audio signals while at the same time providing for accurate depth determination with use of TOF techniques. The provided depth determination capability may be used to identify various hand gestures made by the wearer of the HMD 150'.

In one embodiment, processing unit 4 is worn on the user's wrist and includes some of the computing power used to operate see-through head-mounted display 150'. Processing unit 4 may communicate wirelessly (e.g., WiFi, Bluetooth, infra-red, or other wireless communication means) to one or more hub computing systems 10.

Hub computing system 10 may include a computer, a gaming system or console, or the like. According to an example embodiment, the hub computing system 10 may include hardware components and/or software components such that hub computing system 10 may be used to execute applications such as real-time, multi-user gaming applications, non-gaming applications, or the like. In one embodiment, hub computing system 10 may include a processor such as a standardized processor, a specialized processor (e.g., one including high speed graphics support firmware), a microprocessor, or the like that may execute instructions stored on a processor readable storage device for performing the processes described herein.

Hub computing system 10 further includes one or more capture devices, such as capture devices 21A and 21B. In other embodiments, more or less than two capture devices can be used to capture the room or other physical environment of the user.

Capture devices 21A and 21B may, for example, include cameras that visually monitor one or more users in the local and surrounding space and capture poses, gestures and/or movements performed by the one or more users, as well as the structure of the surrounding space. The captured real world data may be analyzed, and tracked to perform one or more controls or actions within an application and/or animate an avatar or on-screen character. An application may be executing on hub computing system 10, the worn display device 150', and/or on a non-worn display 16 and/or on a mobile device 5 as discussed below or a combination of these.

Hub computing system 10 may be connected to an audiovisual device 16 such as a television, a monitor, a high-definition television (HDTV), or the like that may provide game or application visuals. For example, hub computing system 10 may include a video adapter such as a graphics card and/or an audio adapter such as a sound card that may provide audiovisual signals associated with the game application, non-game application, etc. The audiovisual device 16 may receive the audiovisual signals from hub computing system 10 and may then output the game or application visuals and/or audio associated with the audiovisual signals. According to one embodiment, the audiovisual device 16 may be connected to hub computing system 10 via, for example, an S-Video cable, a coaxial cable, an HDMI cable, a DVI cable, a VGA cable, component video cable, RCA cables, etc. In one example, audiovisual device 16 includes internal speakers. In other embodiments, audiovisual device 16, a separate stereo or hub computing system 10 is connected to external speakers 22.

Furthermore, as in the hub computing system 10, gaming and non-gaming applications may execute on a processor of the mobile device 4 which user actions control or which user actions animate an avatar as may be displayed on a display 7 of the mobile device 4. The mobile device 4 also provides a network interface for communicating with other computing devices like hub computing system 10 over the Internet or via another communication network via a wired or wireless communication medium. For example, the user may participate in an online gaming session with other mobile device users and those playing on more powerful systems like hub computing system 10. Examples of hardware and software components of a mobile device 4 such as may be embodied in a smartphone or tablet computing device. Some other examples of mobile devices 4 are a laptop or notebook computer and a netbook computer.

Figure 5A:
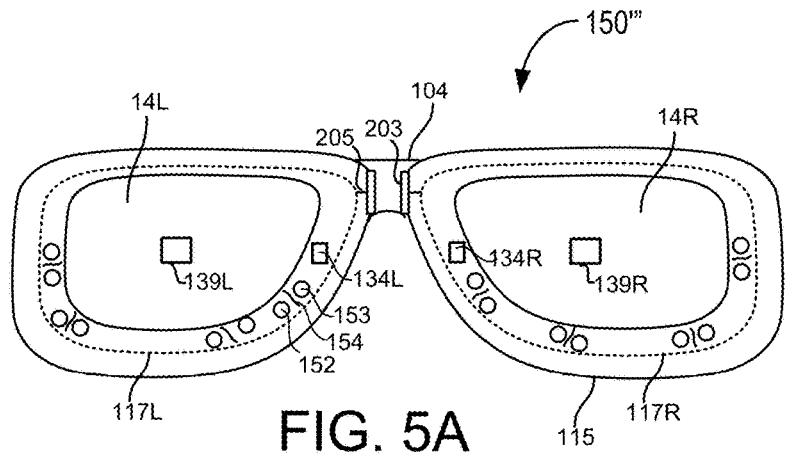
FIGS. 5A, 5B and 5C illustrate exemplary arrangements of various components about the frameworks of respective see-through head-mounted displays embodied as eyeglasses.

FIG. 5A illustrates an exemplary arrangement of a see through, see-through head-mounted display embodied as eyeglasses with movable display optical systems including gaze detection elements (e.g., eye-facing cameras that determine the angle of gaze of each of the user's eyes). What appears as a lens for each eye represents a display optical system 14 for each eye, e.g. 14R and 14L. A display optical system includes a see-through lens, e.g. 116 in FIG. 4, as in an ordinary pair of glasses, but also contains optical elements (e.g. mirrors, filters) for seamlessly fusing virtual content with the actual direct real world view seen through the lenses 116. A display optical system 14 (of which portions 14R and 14L are a part of in FIG. 5A) has an optical axis which is generally in the center of the see-through lens 116, in which light is generally collimated to provide a distortionless view. For example, when an eye care professional fits an ordinary pair of eyeglasses to a user's face, a goal is that the glasses sit on the user's nose at a position where each pupil is aligned with the center or optical axis of the respective lens resulting in generally collimated light reaching the user's eye for a clear or distortionless view.

In the example of FIG. 5A, a detection area 139R, 139L of at least one sensor is aligned with the optical axis of its respective display optical system 14R, 14L so that the center of the detection area 139R, 139L is capturing light along the optical axis. If the respective display optical system 14L, 14R is aligned with the user's respective eye pupil, each detection area 139 of the respective sensor 134 is aligned with the user's pupil. Reflected light of the detection area 139 is transferred via one or more optical elements to an IR and/or RGB image sensor array of the eye-facing camera 134 (not the same as scenery facing camera 165 of FIG. 1A).

In one example, a visible light sensor array also commonly referred to as an RGB camera array may be the eye-facing camera sensor, and an example of an optical element or light directing element is a visible light reflecting mirror which is partially transmissive and partially reflective. In some examples, a camera may be small, e.g. 2 millimeters (mm) by 2 mm. The respective eye-facing camera 134L, 134R may further include an IR sensor array to which reflected IR radiation from spaced apart target objects may be directed. In some examples, the camera 134 may be a combination of an RGB and IR sensor arrays, and the light directing elements may include a visible light reflecting or diverting element and an IR radiation reflecting or diverting element.

In the example of FIG. 5A, there are four sets of gaze determining illuminators 153 (e.g., IR laser light emitters) paired with a respective eye-facing photodetector 152 for determining gaze direction and separated by a barrier 154 to avoid interference between the incident light generated by the illuminators 153 and the reflected light received at the photodetector 152. Additionally outward scene illuminating laser emitters (e.g., 162a, 162b, not shown in FIG. 5A) are provided on the other side of the eyeglass/giggles frame to provided TOF determination. For example the outward scene illuminating laser emitters (e.g., 162a, 162b) may be mounted on a PCB as indicated in FIG. 1A. To avoid unnecessary clutter in the drawings, drawing numerals are shown with respect to one of left and right eye pairs. Each illuminator may be an infra-red (IR) illuminator which generates a narrow beam of light at predetermined one or more wavelengths for example in the infrared and/or near infrared (NIR) portion of the spectrum. Each of the photodetectors may be selected to capture light at the predetermined one or more wavelengths. Infra-red may also include near-infrared.

In FIG. 5A, each display optical system 14 has a respective arrangement of gaze detection elements facing each eye such as camera 134 (having left and right eye parts 134L and 134R) and its detection area 139, optical alignment elements (not shown), the illuminators 153 and photodetectors 152 are located on a movable inner frame portion 117L, 117R. In this example, a display adjustment mechanism comprises one or more motors 203 each having a respective shaft 205 which attaches to an object for pushing and pulling the object in at least one of three dimensions. In this example, the object is the inner frame portion 117 which slides from left to right or vise versa within the frame 115 under the guidance and power of shafts 205 driven by motors 203. In other embodiments, one motor 203 may drive both inner frames. In one embodiment, a processor of control circuitry 136 of the display device 150 is able to connect to the one or more motors 203 via electrical connections within the frame 102 for controlling adjustments in different directions of the shafts 205 by the motors 203. Furthermore, the motors 203 access a power supply via the electrical connections of the frame 102 as well.

Figure 5B:
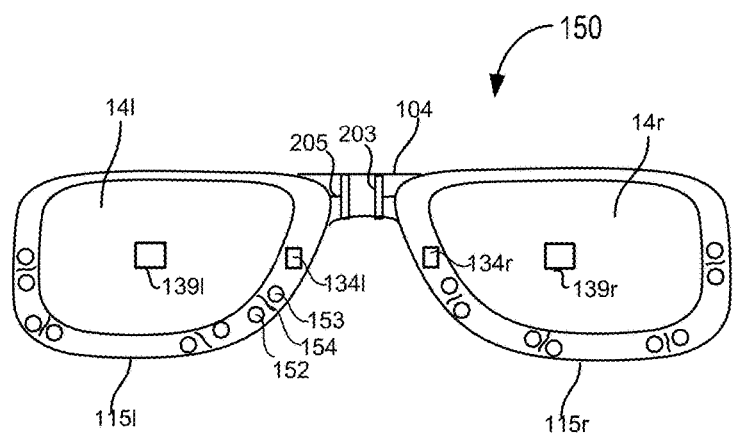

FIG. 5B illustrates another exemplary arrangement of a see through, see-through head-mounted display embodied as eyeglasses with movable display optical systems including gaze detection elements. In this embodiment, the each display optical system 14 is enclosed in a separate frame portion 115l, 115r, e.g. a separate eyeglass framed section, which is movable individually by the motors 203. In some embodiments, the movement range in any dimension is less than 10 millimeters. In some embodiments, the movement range is less than 6 millimeters depending on the range of frame sizes offered for a product. For the horizontal direction, moving each frame a few millimeters left or right will not impact significantly the width between the eyeglass temples, e.g. 102, which attach the display optical systems 14 to the user's head.

Figure 5C:
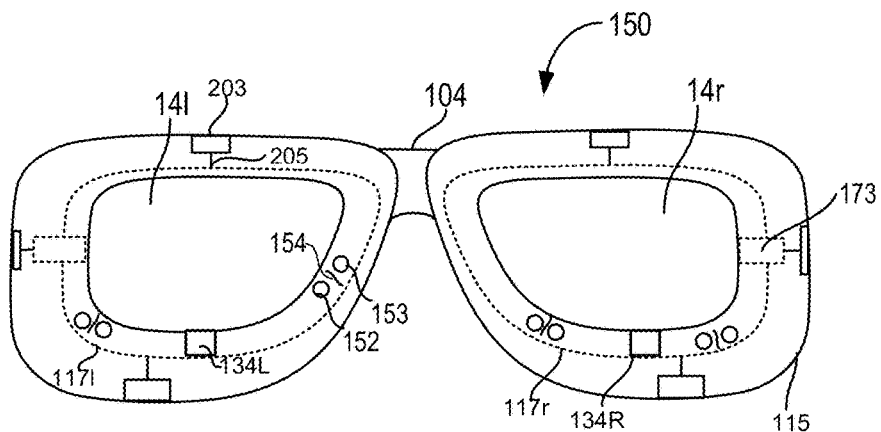

FIG. 5C illustrates another exemplary arrangement of a see through, see-through head-mounted display embodied as eyeglasses with movable display optical systems including gaze detection elements. In this example, the sensor 134r, 134l itself is in line or aligned with the optical axis at the center of its respective display optical system 14r, 14l but located on the frame 115 below the system 14. Additionally, in some embodiments, the camera 134 may be a depth camera or include a depth camera In this example, there are two sets of illuminators 153 and photodetectors 152.

Figure 6:
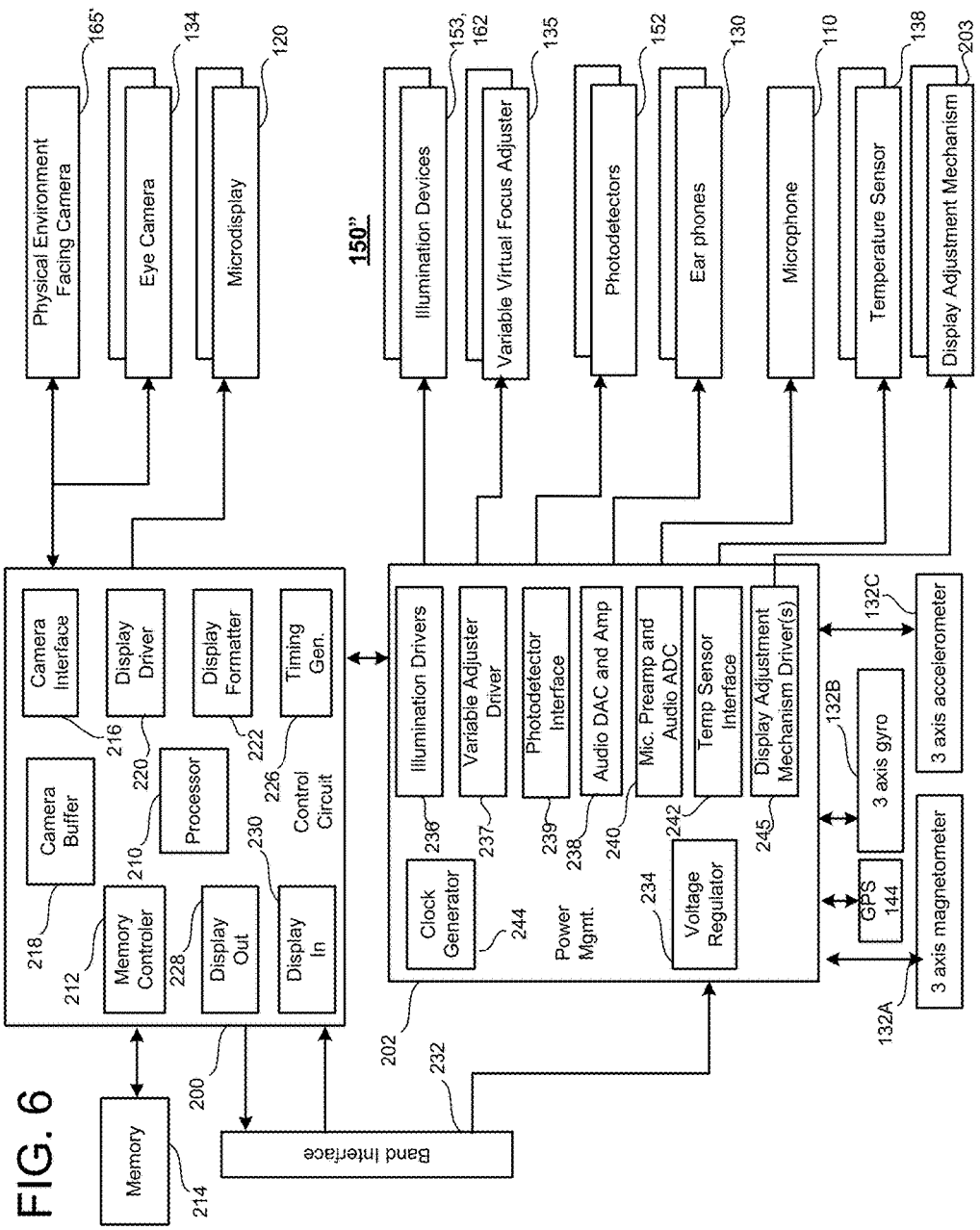
FIG. 6 is a block diagram of one embodiment of hardware and software components of a see-through, near-eye display system as may be used with one or more embodiments.

FIG. 6 is a block diagram of one embodiment of hardware and software components of a see-through, near-eye display unit 150 as may be used with one or more embodiments. In this embodiment, see-through head-mounted display 150", receive instructions about a virtual image from processing unit 210 and provides the sensor information back to processing unit 210. Software and hardware components which may be embodied in a processing unit 210, will receive the sensory information from the display device 150" and may also receive sensory information from hub computing device 10. Based on that information (including depth information obtained from the TOF sub-system), processing unit 210 will determine where and when to provide a virtual image to the user and send instructions accordingly to the control circuitry 136 of the display device 150".

Note that some of the components of FIG. 6 (e.g., eye cameras 134, variable virtual focus adjuster 135, photodetector interface 139, micro display 120, illumination device 153 or illuminators, earphones 130, temperature sensor 138, display adjustment mechanism 203) are shown in shadow to indicate that there are two of each of those devices, one for the left side 14L and one for the right side 14R of head mounted display device 150". FIG. 6 shows the control circuit 200 in communication with the power management circuit 202. Control circuit 200 includes processor 210, memory controller 212 in communication with memory 214 (e.g., D-RAM), camera interface 216, camera buffer 218, display driver 220, display formatter 222, timing generator 226, display out interface 228, and display in interface 230. In one embodiment, all of components of control circuit 220 are in communication with each other via dedicated lines of one or more buses. In another embodiment, each of the components of control circuit 200 are in communication with processor 210.

Cameras interface 216 provides an interface to the physical environment facing camera 165' and each eye camera 134 and stores respective images received from the cameras 165', 134 in camera buffer 218 (which includes a Z depth data storing portion and an RGB plane image storing portion for the case of the depth camera 165'). Display driver 220 will drive microdisplay 120. Display formatter 222 may provide information, about the virtual image being displayed on microdisplay 120 to one or more processors of one or more computer systems, e.g. 20, 12, 210 performing processing for the augmented reality system. Timing generator 226 is used to provide timing data for the system. Display out 228 is a buffer for providing images from physical environment facing cameras 113 and the eye cameras 134 to the processing unit 4. Display in 230 is a buffer for receiving images such as a virtual image to be displayed on microdisplay 120. Display out 228 and display in 230 communicate with interface 232 which is an interface to processing unit 4.

Power management circuit 202 includes voltage regulator 234, eye tracking illumination driver 236, variable adjuster driver 237, photodetector interface 239, audio DAC and amplifier 238, microphone preamplifier and audio ADC 240, temperature sensor interface 242, display adjustment mechanism driver(s) 245 and clock generator 244. Voltage regulator 234 receives power from processing unit 4 via band interface 232 and provides that power to the other components of head mounted display device 150. Illumination drivers 236 provide the IR lightsource drive signals for illumination devices 153, 162 as described above. Audio DAC and amplifier 238 receives the audio information from earphones 130. Microphone preamplifier and audio ADC 240 provides an interface for microphone 110. Temperature sensor interface 242 is an interface for temperature sensor 138. One or more display adjustment drivers 245 provide control signals to one or more motors or other devices making up each display adjustment mechanism 203 indicating which represent adjustment amounts of movement in at least one of three directions. Power management unit 202 also provides power and receives data back from three axis magnetometer 132A, three axis gyro 132B and three axis accelerometer 132C. In one embodiment, the power management circuit 202 includes a recharging management module (not shown) which allows the small on-board batteries (not shown, e.g. 3 VDC, 4.5 VDC) to be recharged in a detachably wired or wireless manner from an external source.

The variable adjuster driver 237 provides a control signal, for example a drive current or a drive voltage, to the adjuster 135 to move one or more elements of the microdisplay assembly 173 to achieve a displacement for a focal region calculated by software executing in the processing unit 4 or the hub computer 10 or both. In embodiments of sweeping through a range of displacements and, hence, a range of focal regions, the variable adjuster driver 237 receives timing signals from the timing generator 226, or alternatively, the clock generator 244 to operate at a programmed rate or frequency.

The photodetector interface 239 receives performs any analog to digital conversion needed for voltage or current readings from each photodetector, stores the readings in a processor readable format in memory via the memory controller 212, and monitors the operation parameters of the photodetectors 152 such as temperature and wavelength accuracy.

FIG. 7 is a block diagram of one embodiment of the hardware and software components of a processing unit 4 associated with a see-through, near-eye display unit. The mobile device 4 may include this embodiment of hardware and software components as well or similar components which perform similar functions. FIG. 7 shows controls circuit 304 in communication with power management circuit 306. Control circuit 304 includes a central processing unit (CPU) 320, graphics processing unit (GPU) 322, cache 324, RAM 326, memory control 328 in communication with memory 330 (e.g., D-RAM), flash memory controller 332 in communication with flash memory 334 (or other type of non-volatile storage), display out buffer 336 in communication with see-through, see-through head-mounted display 150 via band interface 302 and band interface 232, display in buffer 338 in communication with see-through head-mounted display 150 via band interface 302 and band interface 232, microphone interface 340 in communication with an external microphone connector 342 for connecting to a microphone, PCI express interface for connecting to a wireless communication device 346, and USB port(s) 348.

In one embodiment, wireless communication component 346 can include a Wi-Fi enabled communication device, Bluetooth communication device, infrared communication device, etc. The USB port can be used to dock the processing unit 4 to hub computing device 10 in order to load data or software onto processing unit 210 as well as charge processing unit 4. In one embodiment, CPU 320 and GPU 322 are the main workhorses for determining an XYZ mapping of the user's environment (including based on TOF determinations) and of where, when and how to insert images into the view of the user.

Power management circuit 306 includes clock generator 360, analog to digital converter 362, battery charger 364, voltage regulator 366, see-through, near-eye display power source 376, and temperature sensor interface 372 in communication with temperature sensor 374 (located on the wrist band of processing unit 4). An alternating current to direct current converter 362 is connected to a charging jack 370 for receiving an AC supply and creating a DC supply for the system. Voltage regulator 366 is in communication with battery 368 for supplying power to the system. Battery charger 364 is used to charge battery 368 (via voltage regulator 366) upon receiving power from charging jack 370. Device power interface 376 may provide recharging power to the smaller on-board batteries of the display device 150. The voltage regulator may provide one or more of specific voltages for powering the HMD 150 including for example a 3.0 VDC signal and a 4.5 VDC signal.

The figures above provide examples of geometries of elements for a display optical system which provide a basis for different methods of determining Z-depth as discussed above. The method embodiments may refer to elements of the systems and structures above for illustrative context; however, the method embodiments may operate in system or structural embodiments other than those described above.

The example computer systems illustrated in the figures include examples of computer readable storage media. Computer readable storage media are also processor readable storage media. Such media may include volatile and nonvolatile, removable and non-removable media implemented in any method or technology for storage of information such as computer readable instructions, data structures, program modules or other data. Computer storage media includes, but is not limited to, RAM, ROM, EEPROM, cache, flash memory or other memory technology, CD-ROM, digital versatile disks (DVD) or other optical disk storage, memory sticks or cards, magnetic cassettes, magnetic tape, a media drive, a hard disk, magnetic disk storage or other magnetic storage devices, or any other medium which can be used to store the desired information and which can accessed by a computer.

What has been disclosed therefore is a method of reducing risk of overheat damage in a circuit having high powered components (e.g., laser light emitters) that are switched on and off by digitally defined pulses where the digitally defined pulses can include one or more pulses that are unduly wide and/or are unduly too close together such that there is substantial risk of overheating of one or more of the high powered components and/or of other nearby components (e.g., those mounted on a same PCB), where the method comprises: (a) integrating over time and with analog integration circuitry, the digitally defined pulses; and (b) applying an output of the analog integration circuitry to a voltage triggered clamping device, the voltage triggered clamping device having a predetermined threshold voltage at and above which it is switched from a relatively low transconductance mode to a substantially higher transconductance mode, the voltage triggered clamping device being coupled to a current supplying circuit branch that has an ability to supply current for switching on one or more of the high powered components; wherein when the voltage triggered clamping device is in its relatively low transconductance mode, it does not significantly interfere with the ability of the current supplying circuit branch to supply current for switching on the one or more of the high powered components; and wherein when the voltage triggered clamping device is in its substantially higher transconductance mode, it removes current from the current supplying circuit branch and thereby significantly impedes the ability of the current supplying circuit branch to supply current for switching on the one or more of the high powered components.

The disclosed method may be one wherein the voltage triggered clamping device includes a junction type semiconductive device whose voltage to current transconductance characteristic curve has a knee at the predetermined threshold voltage whereby the junction type semiconductive device exhibits a relatively small transconductance slope when driven below the predetermined threshold voltage and a substantially larger transconductance slope when driven at or above the predetermined threshold voltage. The disclosed method may be one wherein a transconductance slope of the junction type semiconductive device when driven above the predetermined threshold voltage is at least ten times (10×) that of when driven below the predetermined threshold voltage. The disclosed method may be one wherein a transconductance slope of the junction type semiconductive device when driven above the predetermined threshold voltage is at least a hundred times (100×) that of when driven below the predetermined threshold voltage. The disclosed method may be one wherein the junction type semiconductive device includes a first bipolar junction transistor (BJT). The disclosed method may be one wherein the current supplying circuit branch includes a base-to-emitter branch of a second bipolar junction transistor (BJT). The disclosed method may be one wherein the current supplying circuit branch includes a source-to-drain branch of a field effect device that supplies drive current to the base-to-emitter branch of the second BJT. The disclosed method may be one wherein the field effect device is configure to exhibit a relatively large drain-to-source voltage drop when the voltage triggered clamping device is switched to its higher transconductance mode and to exhibit a substantially smaller drain-to-source voltage drop when the voltage triggered clamping device is not switched to its higher transconductance mode. The disclosed method may be one wherein the voltage triggered clamping device is additionally coupled to an inductive circuit that is configured to switching off one or more of the high powered components when the voltage triggered clamping device is switched to its higher transconductance mode.

What has been disclosed includes a pulse duration limiting circuit for use in a system having high powered components that are switched on and off by digitally defined pulses where the digitally defined pulses can include one or more pulses that are unduly wide and/or are unduly too close together such that there is substantial risk of overheating of one or more of the high powered components and/or of other nearby components of the system, the circuit comprising: (a) an analog integrator configured to integrate over time, the digitally defined pulses; and (b) a voltage triggered clamping device coupled to an output of the analog integrator, the voltage triggered clamping device having a predetermined threshold voltage at and above which it is switched from a relatively low transconductance mode to a substantially higher transconductance mode, wherein the voltage triggered clamping device is coupled to a current supplying circuit branch of the system, the current supplying circuit branch being one that has an ability to supply current for switching on one or more of the high powered components; wherein when the voltage triggered clamping device is in its relatively low transconductance mode, it does not significantly interfere with the ability of the current supplying circuit branch to supply current for switching on the one or more of the high powered components of the system; and wherein when the voltage triggered clamping device is in its substantially higher transconductance mode, it removes current from the current supplying circuit branch and thereby significantly impedes the ability of the current supplying circuit branch to supply current for switching on the one or more of the high powered components of the system.

The disclosed circuit may be one wherein the voltage triggered clamping device includes a junction type semiconductive device whose voltage to current transconductance characteristic curve has a knee at the predetermined threshold voltage whereby the junction type semiconductive device exhibits a relatively small transconductance slope when driven below the predetermined threshold voltage and a substantially larger transconductance slope when driven at or above the predetermined threshold voltage. The disclosed circuit may be one wherein a transconductance slope of the junction type semiconductive device when driven above the predetermined threshold voltage is at least ten times (10×) that of when driven below the predetermined threshold voltage. The disclosed circuit may be one wherein a transconductance slope of the junction type semiconductive device when driven above the predetermined threshold voltage is at least a hundred times (100×) that of when driven below the predetermined threshold voltage. The disclosed circuit may be one wherein the junction type semiconductive device includes a first bipolar junction transistor (BJT). The disclosed circuit may be one wherein the current supplying circuit branch includes a base-to-emitter branch of a second bipolar junction transistor (BJT). The disclosed circuit may be one wherein the current supplying circuit branch includes a source-to-drain branch of a field effect device that supplies drive current to the base-to-emitter branch of the second BJT.

What has been disclosed includes a time of photonic flight (TOF) determining system comprising: (a) a plurality of light emitters respectively configured to output respective bursts of photonic pulses for reflection from objects disposed within a predetermined range of distances; (b) a plurality of emitter drivers connected to corresponding ones of the light emitters and respectively configured to output corresponding pulses of current for driving the light emitters and thus causing the light emitters to output their respective bursts of photonic pulses; (c) one or more pulse train generating circuits, each being digitally programmable to output a programmably defined waveform of spaced apart pulses having respective, programmably defined pulse widths; (d) a plurality of pulse duration limiting circuits operatively coupled to corresponding ones of the emitter drivers, where each emitter driver has a respective current supplying circuit branch having an ability to supply a control current for switching on a higher powered component of the emitter driver; wherein one or more of the pulse duration limiting circuits respectively comprises: (e) an analog integrator configured to integrate over time, the programmably defined pulses of a corresponding one of the pulse train generating circuits; and (f) a voltage triggered clamping device coupled to an output of the analog integrator, the voltage triggered clamping device having a predetermined threshold voltage at and above which it is switched from a relatively low transconductance mode to a substantially higher transconductance mode, wherein the voltage triggered clamping device is coupled to the respective current supplying circuit branch of a corresponding one of the emitter drivers; wherein when the voltage triggered clamping device is in its relatively low transconductance mode, it does not significantly interfere with the ability of the respective current supplying circuit branch to supply current for switching on the one or more of the high powered components of the corresponding emitter driver; and wherein when the voltage triggered clamping device is in its substantially higher transconductance mode, it removes current from the respective current supplying circuit branch and thereby significantly impedes the ability of the current supplying circuit branch to supply current for switching on the one or more of the high powered components of the corresponding emitter driver.

The disclosed TOF determining system may be one further comprising: a printed circuit board on which are mounted at least two of the light emitters, their corresponding emitter drivers, their corresponding plurality of pulse duration limiting circuits and one or more of the pulse train generating circuits. The system may be one wherein the voltage triggered clamping device of at least one of the pulse duration limiting circuits includes a junction type semiconductive device whose voltage to current transconductance characteristic curve has a knee at the predetermined threshold voltage whereby the junction type semiconductive device exhibits a relatively small transconductance slope when driven below the predetermined threshold voltage and a substantially larger transconductance slope when driven at or above the predetermined threshold voltage. The system may be one wherein a transconductance slope of the junction type semiconductive device of the at least one of the pulse duration limiting circuits, when driven above the predetermined threshold voltage is at least a hundred times (100×) that of when driven below the predetermined threshold voltage.

The technology disclosed herein may include that which is described in the general context of computer-executable instructions, such as program modules, being executed by a computer. Generally, program modules include routines, programs, objects, components, data structures, etc. that perform particular tasks or implement particular abstract data types. The technology may also be practiced in distributed computing environments where tasks are performed by remote processing devices that are linked through a communications network. In a distributed computing environment, program modules may be located in both local and remote computer storage media including memory storage devices.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method using analog processing for limiting risk of overheating of circuit components due to digitally set pulse widths, the method comprising:
   integrating over time and with analog integration circuitry, digitally defined pulses that cause a turning on and off of surges of current through a load and a corresponding current switching device; and
   applying an output of the analog integration circuitry to a voltage triggered clamping device, the voltage triggered clamping device having a predetermined threshold voltage at and above which it is switches from being in a first transconductance range to being in a second transconductance range, where transconductances of the second transconductance are substantially larger than corresponding ones of the first transconductance range, the voltage triggered clamping device being coupled to a current supplying circuit branch that has an ability to supply current for switching on said current switching device;
   wherein if the voltage triggered clamping device is in the first transconductance range, it does not significantly interfere with the ability of the current supplying circuit branch to supply current for switching on the current switching device; and
   wherein if the voltage triggered clamping device is in the second transconductance range, it removes a substantial amount of current from the current supplying circuit branch and thereby significantly impedes the ability of the current supplying circuit branch to supply current for switching on the current switching device.

2. The method of claim 1 wherein the voltage triggered clamping device includes a junction type semiconductive device whose voltage to current transconductance characteristic curve has a knee at the predetermined threshold voltage whereby the junction type semiconductive device exhibits a first set of one or more transconductance slopes if driven below the predetermined threshold voltage and a second set of one or more substantially larger, second transconductance slopes if driven at or above the predetermined threshold voltage.

3. The method of claim 2 wherein the second set of one or more transconductance slopes of the junction type semiconductive device corresponding to it being driven above the predetermined threshold voltage are each at least ten times (10×) corresponding ones of the first set of one or more transconductance slopes.

4. The method of claim 2 wherein the second set of one or more transconductance slopes of the junction type semiconductive device corresponding to it being driven above the predetermined threshold voltage are each at least hundred times (100×) corresponding ones of the first set of one or more transconductance slopes.

5. The method of claim 2 wherein the junction type semiconductive device includes a first bipolar junction transistor (BJT).

6. The method of claim 5 wherein the current supplying circuit branch includes a base-to-emitter branch of a second bipolar junction transistor (BJT).

7. The method of claim 6 wherein the current supplying circuit branch includes a source-to-drain branch of a field effect device that supplies drive current to the base-to-emitter branch of the second BJT.

8. The method of claim 7 wherein the field effect device is configure to exhibit a relatively large drain-to-source voltage drop while the voltage triggered clamping device is in the second transconductance range and to exhibit a substantially smaller drain-to-source voltage drop while the voltage triggered clamping device is in the first transconductance range.

9. The method of claim 1 wherein the voltage triggered clamping device is additionally coupled to an inductive circuit that is configured to switch off the current switching device in response to the voltage triggered clamping device switching from its first to its second transconductance range.

10. A pulse duration limiting circuit comprising:
an analog integrator configured to integrate over time, digitally defined pulses that cause episodic turning on and off of surges of current through a load and a corresponding current switching device of a power outputting system; and
a voltage triggered clamping device coupled to an output of the analog integrator, the voltage triggered clamping device having a predetermined threshold voltage at and above which it is switches from being in a first transconductance range to being in a second transconductance range, where transconductances of the second transconductance are substantially larger than corresponding ones of the first transconductance range,
wherein the voltage triggered clamping device is coupled to a current supplying circuit branch of the system, the current supplying circuit branch being one that has an ability to supply current for switching on the switching device of the power outputting system;
wherein if the voltage triggered clamping device is in its first transconductance range, it does not significantly interfere with the ability of the current supplying circuit branch to supply current for switching on the switching device of the power outputting system; and
wherein if the voltage triggered clamping device is in its second transconductance range, it removes a substantial amount of current from the current supplying circuit branch and thereby significantly impedes the ability of the current supplying circuit branch to supply current for switching on the switching device of the power outputting system.

11. The circuit of claim 10 wherein:
the voltage triggered clamping device includes a junction type semiconductive device whose voltage to current transconductance characteristic curve has a knee at the predetermined threshold voltage whereby the junction type semiconductive device exhibits a first set of one or more transconductance slopes if driven below the predetermined threshold voltage and a second set of one or more substantially larger, second transconductance slopes if driven at or above the predetermined threshold voltage.

12. The circuit of claim 11 wherein the second set of one or more transconductance slopes of the junction type semiconductive device corresponding to it being driven above the predetermined threshold voltage are each at least ten times (10×) corresponding ones of the first set of one or more transconductance slopes.

13. The circuit of claim 11 wherein the junction type semiconductive device includes a first bipolar junction transistor (BJT).

14. The circuit of claim 13 wherein the current supplying circuit branch includes a base-to-emitter branch of a second bipolar junction transistor (BJT).

15. The circuit of claim 14 wherein the current supplying circuit branch includes a source-to-drain branch of a field effect device that supplies drive current to the base-to-emitter branch of the second BJT.

16. A time of photonic flight (TOF) determining system comprising:
a plurality of light emitters respectively configured to output respective bursts of photonic pulses for reflection from objects disposed within a predetermined range of distances;
a plurality of emitter drivers connected to corresponding ones of the light emitters and respectively configured to output corresponding pulses of current for driving the light emitters and thus causing the light emitters to output their respective bursts of photonic pulses;
one or more pulse train generating circuits, each being digitally programmable to output a programmably defined waveform of spaced apart pulses having respective, programmably defined pulse widths;
a plurality of pulse duration limiting circuits operatively coupled to corresponding ones of the emitter drivers, where each emitter driver has a respective current supplying circuit branch having an ability to supply a control current for switching on a power switching device of the emitter driver;
wherein one or more of the pulse duration limiting circuits respectively comprises:
an analog integrator configured to integrate over time, the programmably defined pulses of a corresponding one of the pulse train generating circuits; and
a voltage triggered clamping device coupled to an output of the analog integrator, the voltage triggered clamping device having a predetermined threshold voltage at and above which it is switched from a first transconductance mode to a second transconductance mode, transconductances of the second transconductance mode being substantially greater than corresponding transconductances of the first transconductance mode,
wherein the voltage triggered clamping device is coupled to the respective current supplying circuit branch of a corresponding one of the emitter drivers;
wherein if the voltage triggered clamping device is in its first transconductance mode, it does not significantly interfere with the ability of the respective current supplying circuit branch to supply current for switching on the power switching device of the corresponding emitter driver; and
wherein if the voltage triggered clamping device is in its second transconductance mode, it removes current from the respective current supplying circuit branch and thereby significantly impedes the ability of the current supplying circuit branch to supply current for switching on the power switching device of the corresponding emitter driver.

17. The TOF determining system of claim 16 and further comprising:
   a printed circuit board on which are mounted at least two of the light emitters, their corresponding emitter drivers, their corresponding plurality of pulse duration limiting circuits and one or more of the pulse train generating circuits.

18. The TOF determining system of claim 17 wherein:
   the voltage triggered clamping device of at least one of the pulse duration limiting circuits includes a junction type semiconductive device whose voltage to current transconductance characteristic curve has a knee at the predetermined threshold voltage whereby the junction type semiconductive device exhibits one or more relatively small transconductance slopes if driven below the predetermined threshold voltage and one or more substantially larger transconductance slopes if driven at or above the predetermined threshold voltage.

19. The TOF determining system of claim 18 wherein:
   the one or more transconductance slopes of the junction type semiconductive device of the at least one of the pulse duration limiting circuits, while driven above the predetermined threshold voltage are each at least a hundred times (100×) respective transconductance slopes of the junction type semiconductive device while driven below the predetermined threshold voltage.

20. The TOF determining system of claim 19 wherein:
   the junction type semiconductive device includes a bipolar junction transistor (BJT).

* * * * *